United States Patent

Moriizumi et al.

[11] Patent Number: 5,812,412
[45] Date of Patent: Sep. 22, 1998

[54] CHARGED BEAM PATTERN DATA GENERATING METHOD AND A CHARGED BEAM PATTERN DATA GENERATING APPARATUS

[75] Inventors: Koichi Moriizumi; Kinya Kamiyama; Makoto Kanno; Hironobu Taoka; Hiroomi Nakao; Kazuhiro Yamazaki, all of Itami, Japan

[73] Assignee: Mitsubishi Denki Kabushiki Kaisha, Tokyo, Japan

[21] Appl. No.: 535,729

[22] Filed: Sep. 28, 1995

[30]    Foreign Application Priority Data

Apr. 28, 1995   [JP]   Japan .................................. 7-105765

[51] Int. Cl.⁶ .................................................. G06F 17/50
[52] U.S. Cl. ...................................... 364/488; 364/468.28
[58] Field of Search ..................................... 364/488, 489, 364/490, 491, 578, 468.28; 430/296, 327; 250/492.2, 492.22, 492.3; 382/144, 145, 147, 149

[56]              References Cited

U.S. PATENT DOCUMENTS

| 4,132,898 | 1/1979 | Buelow et al. ...................... 250/492 A |
| 4,532,598 | 7/1985 | Shibayama et al. ..................... 364/491 |
| 4,718,019 | 1/1988 | Fillion et al. ........................... 364/491 |
| 4,820,928 | 4/1989 | Ooyama et al. ...................... 250/492.2 |
| 4,890,239 | 12/1989 | Ausschnitt et al. ..................... 364/491 |
| 4,943,729 | 7/1990 | Ando et al. ........................... 250/492.3 |
| 5,251,140 | 10/1993 | Chung et al. ........................ 364/474.02 |
| 5,347,592 | 9/1994 | Yasuda et al. ................................ 382/8 |
| 5,366,847 | 11/1994 | Powers ................................... 430/296 |
| 5,371,373 | 12/1994 | Shibata et al. ..................... 250/492.22 |
| 5,434,795 | 7/1995 | Kai et al. ................................. 364/489 |

FOREIGN PATENT DOCUMENTS

| 0608657 | 3/1994 | European Pat. Off. . |
| 0608657 | 8/1994 | European Pat. Off. . |
| 57-012520 | 1/1982 | Japan . |
| 7221003 | 8/1985 | Japan . |
| 1-175737 | 7/1989 | Japan . |
| 4-063419 | 2/1992 | Japan . |
| 5-166706 | 7/1993 | Japan . |
| 7-221003 | 8/1995 | Japan . |
| 2301759 | 12/1996 | United Kingdom . |

*Primary Examiner*—Emanuel Todd Voeltz
*Assistant Examiner*—Leigh Marie Garbowski

[57]                ABSTRACT

A charged beam pattern data generating method for generating high quality pattern data from the circuit layout design data of a semiconductor device for use by a charged beam drawing apparatus in the production of resist patterns or other semiconductor device manufacturing processes.

27 Claims, 41 Drawing Sheets

Of the fine shape
dimension and
downwards

Of the fine shape dimension
and downwards

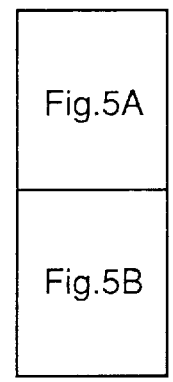
Fig.5A
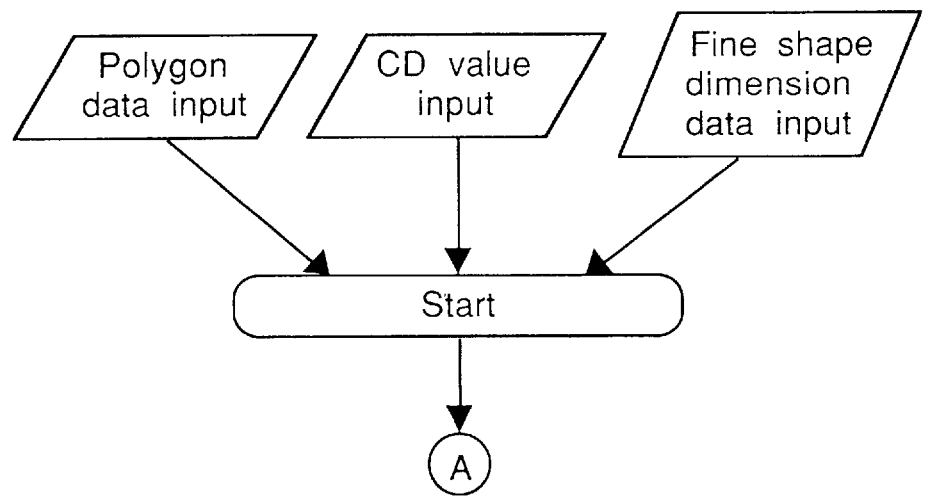

CD value

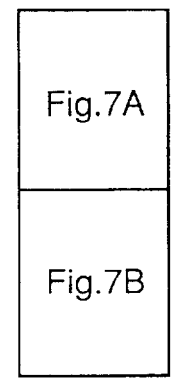
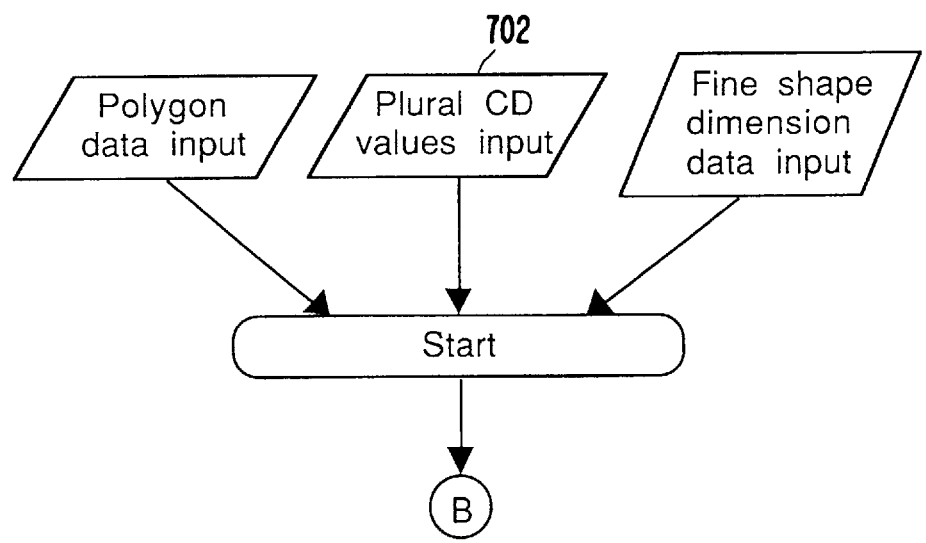
Fig.7A

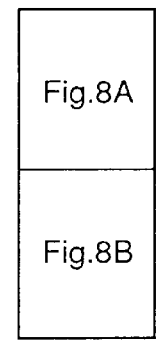
*Fig.8A*
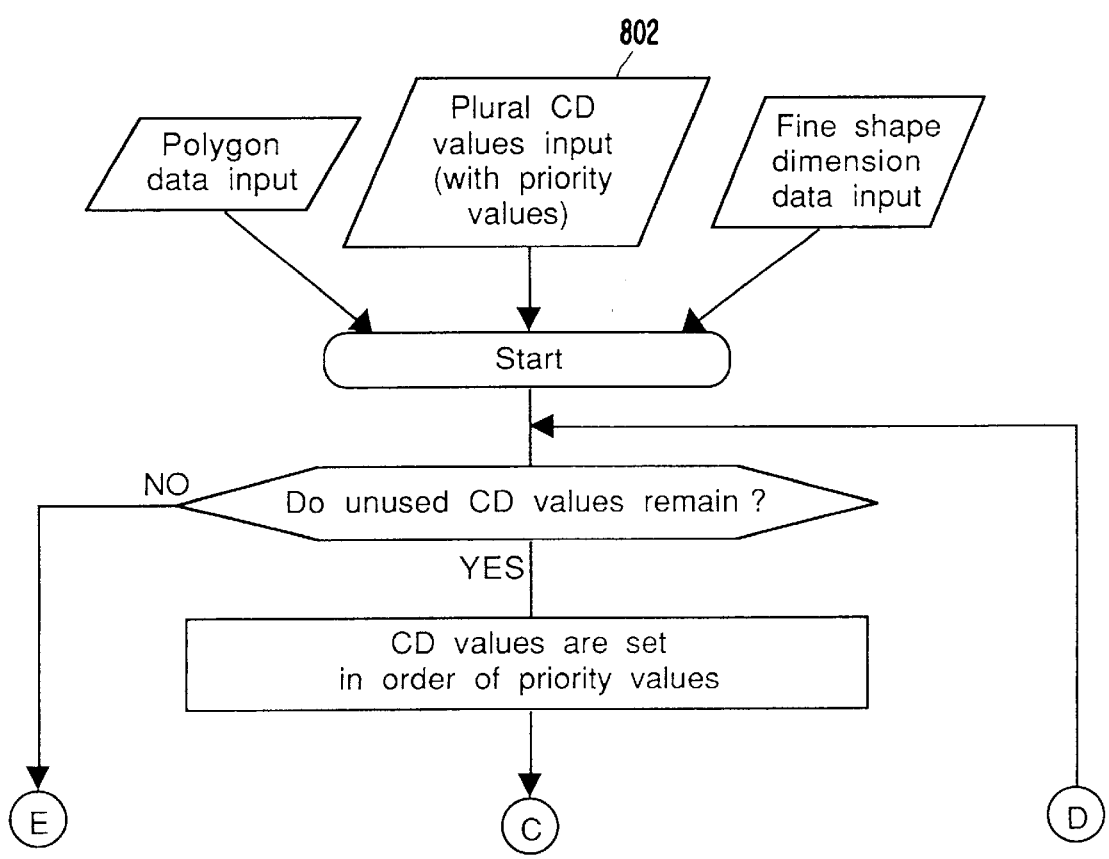

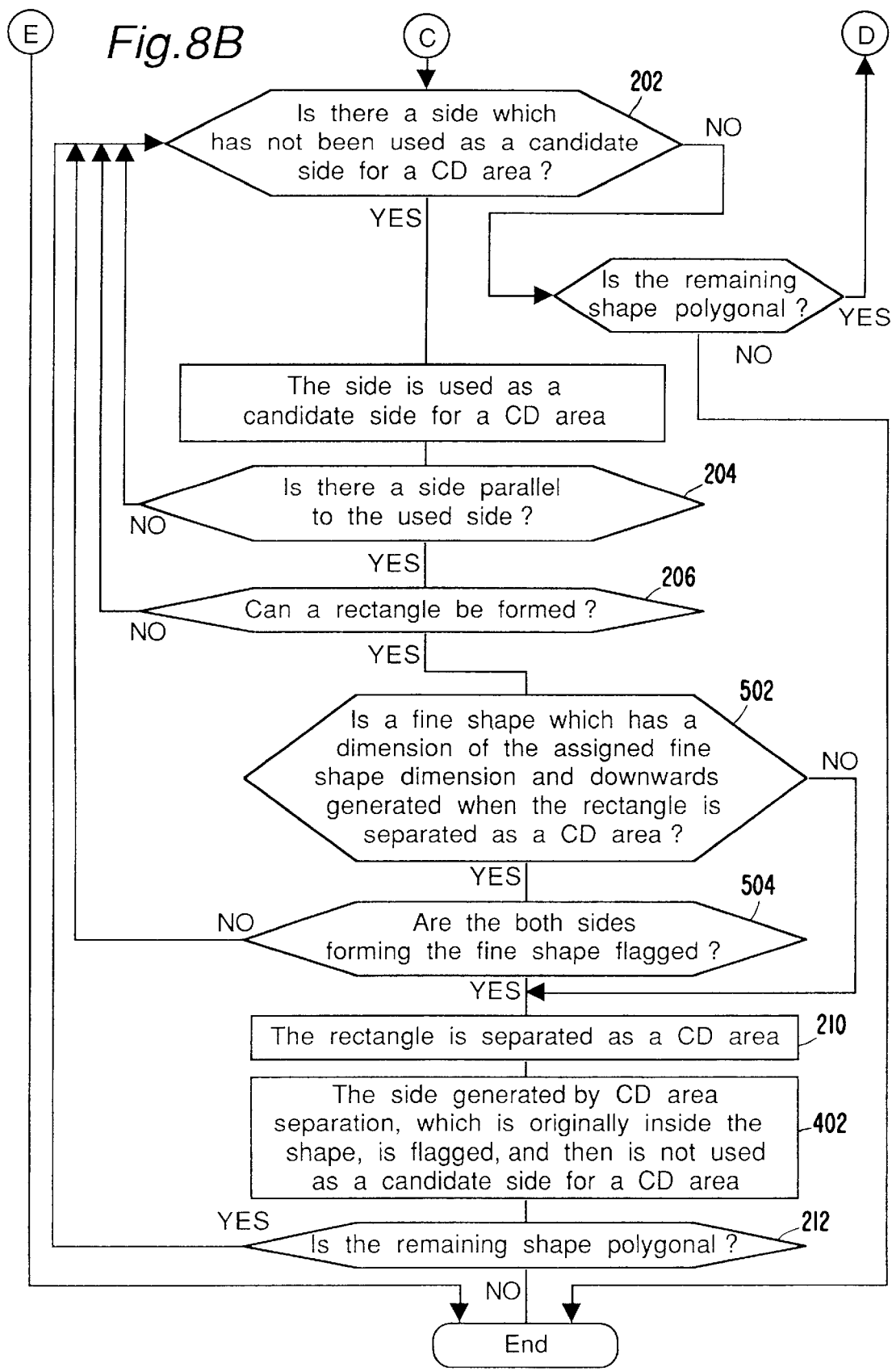

Fig.14
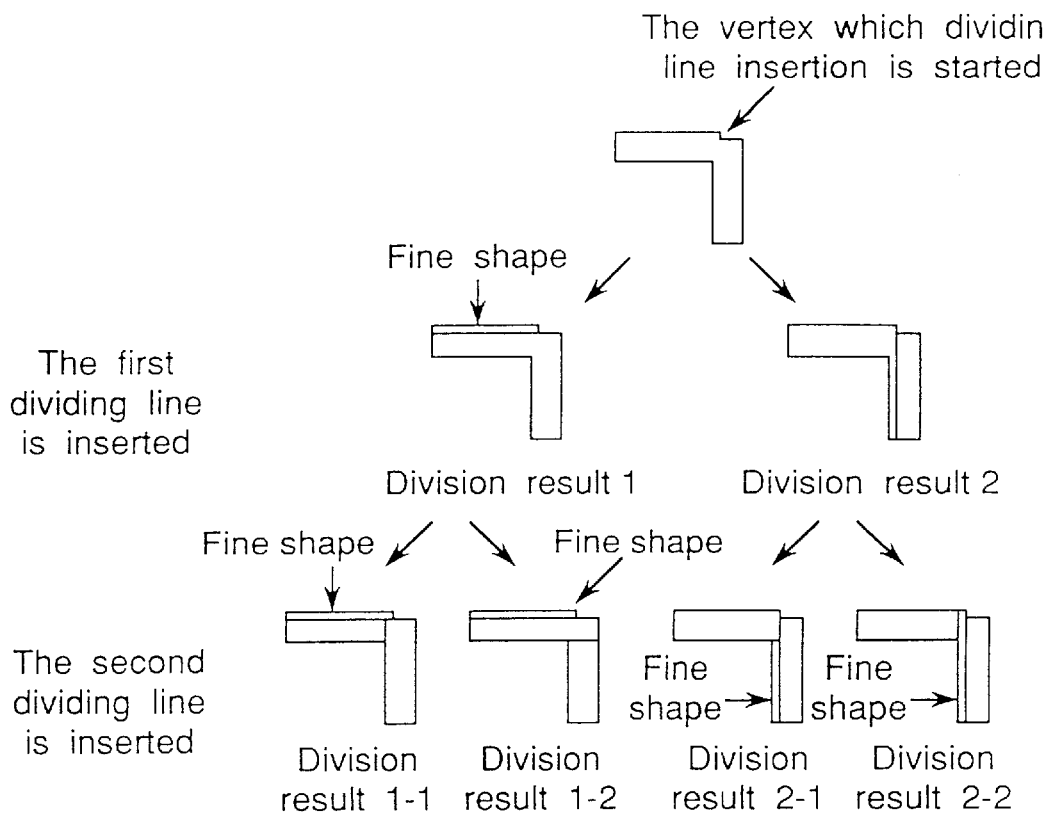
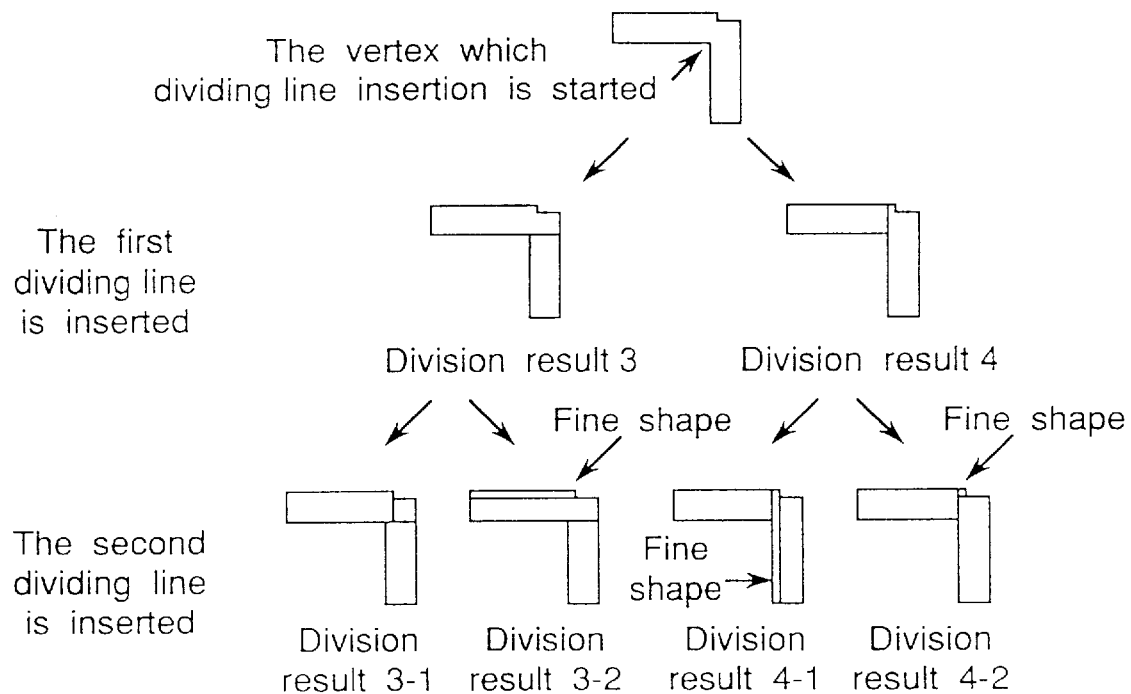

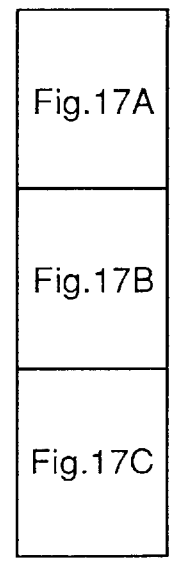
Fig.17
*Fig.17A*
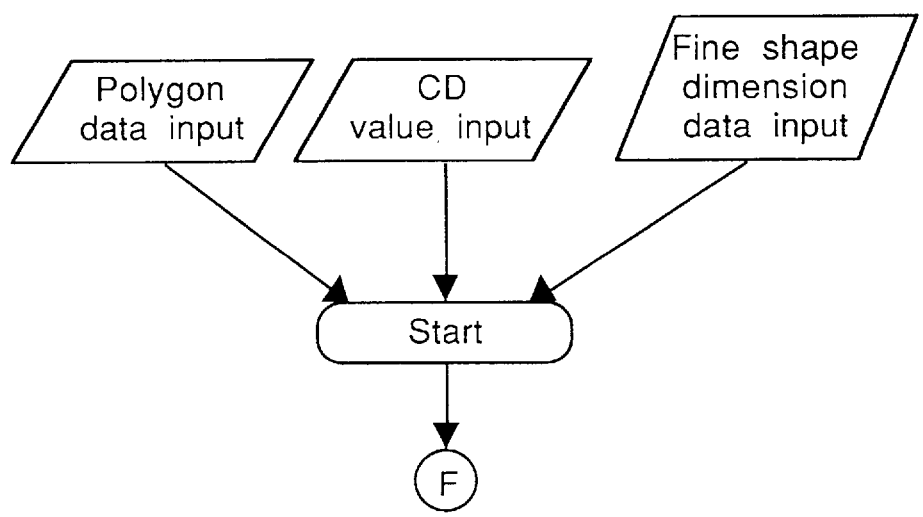

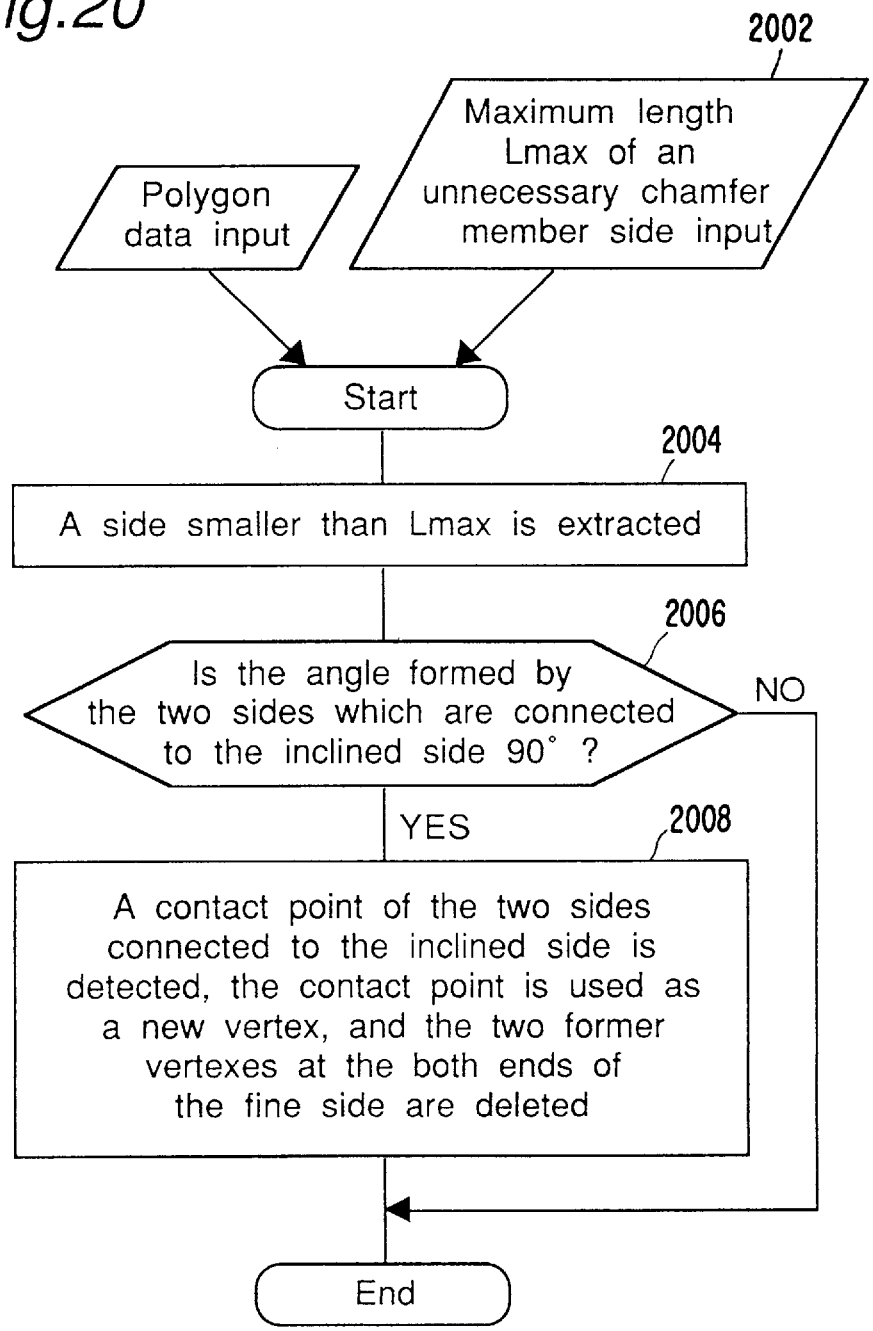

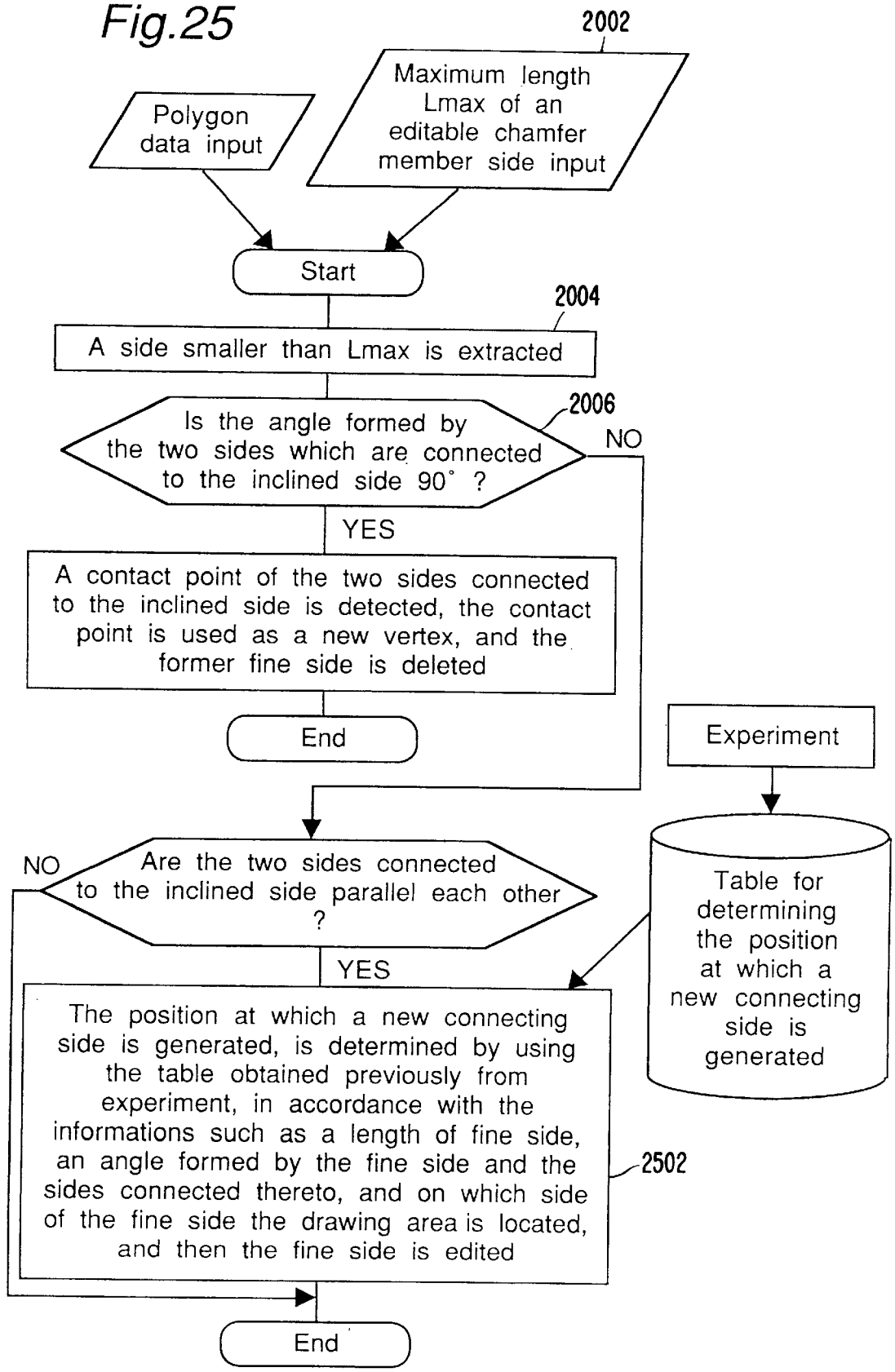

Of the fine shape
dimension and
downwards

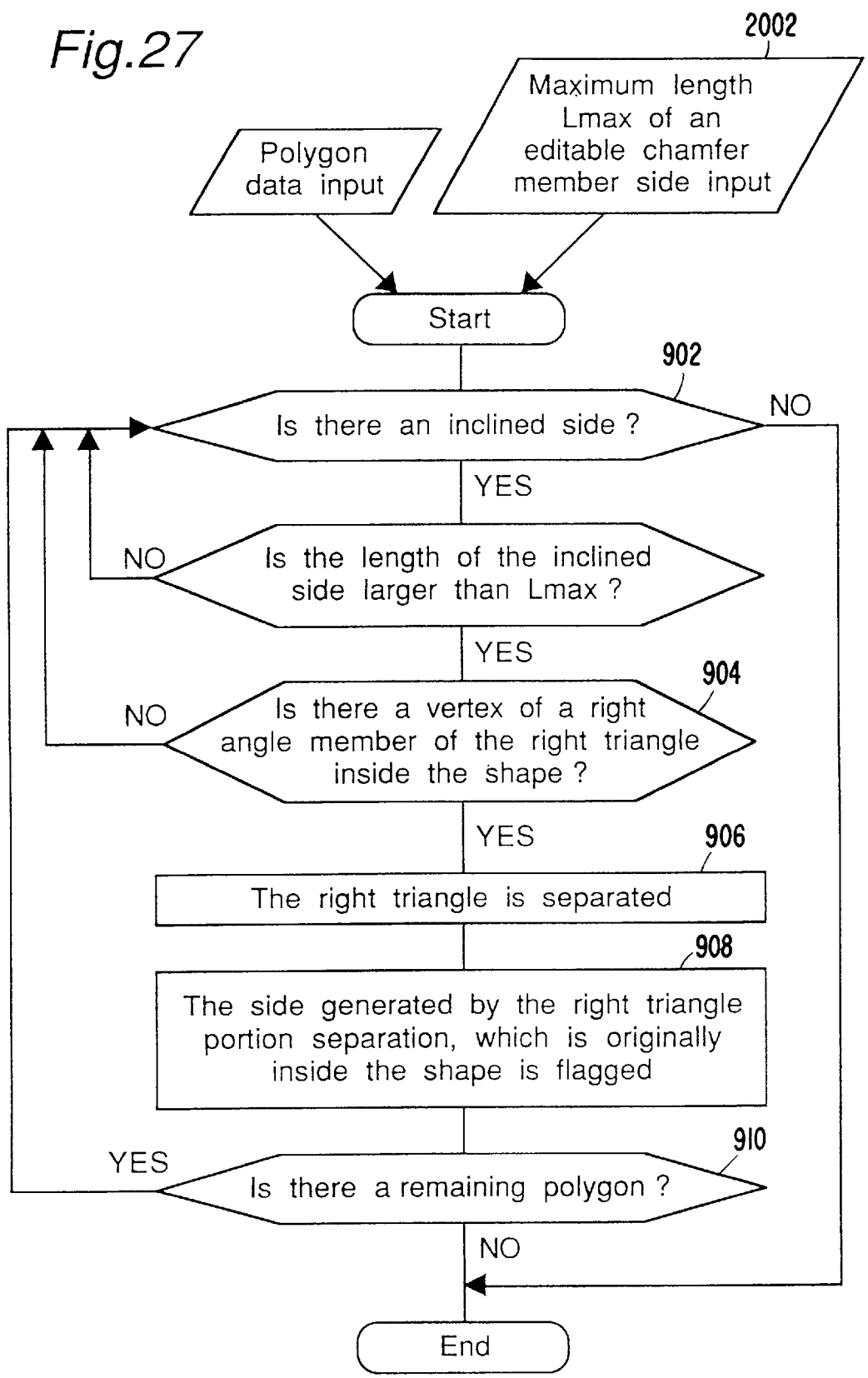

Design layout data

Electron beam drawing data(horizontal division)

Electron beam drawing data(vertical division)

Resist pattern on the mask (a) Dimensional precision of the resist pattern on the mask (drawn by one-shot electron beam)

(b) Dimensional precision of the resist pattern on the mask (drawn by two-shot electron beam)

Fig.32 PRIOR ART
Relation between pattern shape and electron beam power distribution (drawn by one-shot electron beam)
(a) Drawing data
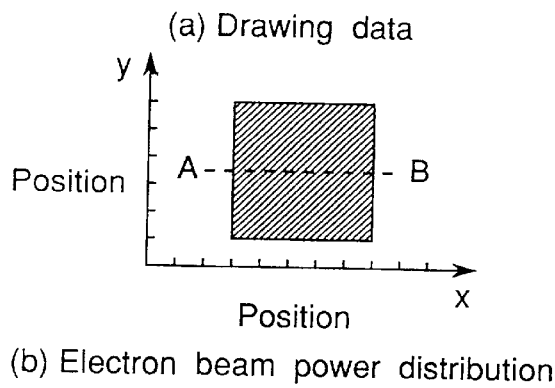
(b) Electron beam power distribution
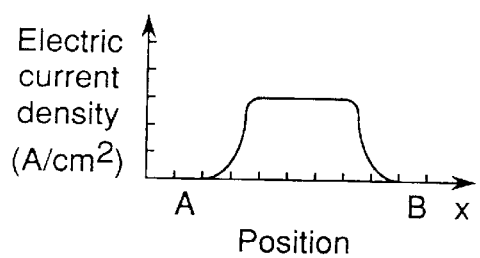
Fig.33 PRIOR ART
Relation between pattern shape and electron beam power distribution
(drawn by two-shot electron beam and fine drawing data)
(a) Drawing data
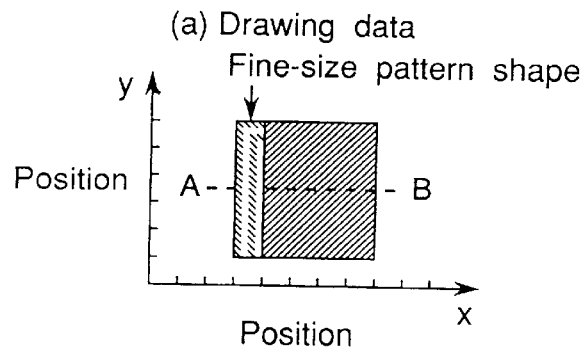
(b) Electron beam power distribution
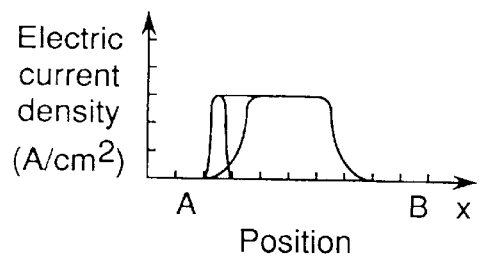

Dimensional precision of the resist pattern on the mask
(drawn by two-shot electron beam and fine drawing data)

Conventional drawing data generating apparatus and data processing flow chart

The state that a process area is divided into slabs

The state that overlapping areas are removed

The state frames set in the process area are converted to vectors and the sign of each vector orientation value is reversed The state that an image inversion process is performed

CHARGED BEAM PATTERN DATA GENERATING METHOD AND A CHARGED BEAM PATTERN DATA GENERATING APPARATUS

BACKGROUND OF THE INVENTION

1. Field of the Invention

The present invention relates to a method and an apparatus for generating the pattern data used by a charged beam drawing apparatus from the circuit layout design data of a semiconductor device.

2. Description of the Prior Art

Charged beam drawing is widely used to produce masks used in the manufacture of semiconductor devices, particularly large-scale integrated devices (LSI), because of its ability to form fine lines with good control characteristics. Charged beam drawing methods used for this purpose can be divided into raster scan and vector scan types.

Raster scan methods have been widely used for mask production because of the relative simplicity of the drawing apparatus and the ease of generating drawing data. The problem with raster scan methods is that the drawing speed is largely dependent upon the minimum grid size (address unit size) used to define the drawing pattern size and the drawing position.

A more recently developed vector scan drawing method, i.e., variable output beam formation drawing, forms the electron beam according to the size of the drawing pattern and emits the electron beam only to the area required. Drawing speed is therefore increased, and the address unit size can be reduced (the scale of integration can be increased).

It is therefore believed that variable output beam formation drawing methods will be the mainstream method used for direct electron beam drawing in the production of masks for 64 megabyte and larger capacity DRAM devices, and the development of 1 gigabyte and larger capacity DRAM devices.

The drawing data generating apparatus and method of the prior art are described below.

The procedure for generating the drawing data and the drawing procedure used in a prior art variable output electron beam drawing method are described first with reference to FIGS. 30A to 30D.

A sample of the design data for the circuit layout of a semiconductor device is shown in FIG. 30A. The design data for a design component such as this normally defines a polygon, which must then be separated into the basic geometric elements of the polygon in order to draw the circuit layout using the variable output electron beam. This separation is illustrated in FIGS. 30B and 30C wherein a dividing line has been inserted from the vertices of the polygon horizontally and vertically, respectively, to extract two component rectangles.

The actual drawing procedure using the drawing data thus separated into the basic shape components is described below with reference to FIG. 30B.

When the pattern data for the shaded area in FIG. 30B is input to the electron beam drawing apparatus, an electron beam of width Ws1 and height Hs1 is generated by the deflector for electron beam generation.

The electron beam thus generated is then moved to the emission position (x1, y1) by the deflector for setting the electron beam emission position, and is then emitted to the resist coated to the mask or silicon wafer substrate for the time corresponding to the exposure required by the sensitivity of the resist.

When the pattern data for the dotted area in FIG. 30B is input to the electron beam drawing apparatus, the dotted area is drawn by the electron beam in the same manner. This process is thereafter sequentially repeated to draw the complete pattern of the semiconductor device.

The problems with generating the drawing data of the variable output electron beam drawing apparatus described above are described below.

The shape of the resist pattern formed as a result of converting the circuit layout design data to drawing data as shown in FIG. 30B, drawing the circuit layout with an electron beam using the drawing data, and then developing the resist, is shown in FIG. 30D. Factors contributing to deterioration in the precision of the pattern dimensions are considered below with respect to the width Wm of the resist pattern. Note that factors relating to the process conditions of pattern formation, including resist development, are not considered below.

When the circuit layout design data shown in FIG. 30A is divided by a horizontal dividing line as shown in FIG. 30B, the only factor affecting the dimension of width Wm is the precision of the generated electron beam, which is formed according to the shape of the shaded area in FIG. 30B, i.e., the dimensional precision of the electron beam in the area corresponding to width Ws1.

However, when the design data is separated by a vertical dividing line as shown in FIG. 30C, the factors affecting the dimension of width Wm include the precision of the electron beam emission position corresponding to the shaded area of FIG. 30C, and the formation precision and electron beam positioning precision corresponding to the dotted area in FIG. 30C.

The measured results of plural resist patterns formed using the drawing data generated by different division methods shown in FIGS. 30B and 30C are shown in FIGS. 31A and 31B.

The data shown in FIG. 31A was obtained using the drawing data shown in FIG. 30B to form a resist pattern in the area of width Wm by means of a one-shot electron beam irradiation. The data shown in FIG. 31B was obtained using the drawing data shown in FIG. 30C to form a resist pattern in the area of width Wm by means of a two shot electron beam irradiation.

As shown by FIGS. 31A and 30B, while the dimensional precision of the resist pattern formed by one-shot electron beam emission is ±0.025 $\mu$m, the dimensional precision of the resist pattern formed by two-shot electron beam emission is ±0.075 $\mu$m, demonstrating a significant increase in pattern dimension variation, i.e., deterioration of dimensional precision.

From this finding it may be concluded that those parts of the circuit pattern essential to the device characteristics (e.g., elements corresponding to the gate electrodes of transistor elements) should be drawn insofar as possible by means of one-shot electron beam irradiation, and the basic geometric element separation process must be executed to enable such one-shot electron beam irradiation.

When the resist pattern is formed by means of two or more electron beam irradiation shots at different shot positions, the dimensional precision of the resist pattern formed deteriorates further when the shot(s) forming the edges of the resist pattern are smaller than a particular dimension. This is described with reference to FIGS. 32 and 33 below.

The graph shown in FIG. 32(b) shows the power distribution of the electron beam formed according to the drawing data shown in FIG. 32(a). As shown in the graph, the power distribution rises and falls gradually at the pattern edges rather than sharply in a stepped manner. The sharpness of the power distribution at the pattern edges (referred to as "beam sharpness") varies according to the size of the generated electron beam.

In general, the reaction to the coulomb force in the electron beam increases as the electron beam size increases, and strength distribution at the edges becomes less defined, i.e., beam sharpness deteriorates.

The electron beam power distribution shown in FIG. 33(b) was obtained for an electron beam generated for the drawing data shown in FIG. 32(a) divided into two drawing zones as shown in FIG. 33(a) where the left zone is a small size less than a particular size. As shown in FIG. 33, the beam sharpness at the left edge differs from the beam sharpness in one-shot irradiation. This difference introduces a difference in the dimensions of the resist pattern formed.

Plural resist patterns containing fine drawing data as shown in portion (b) of FIG. 33 were similarly formed with a two-shot process, and measured. The results are shown in FIG. 34. In addition to a significant variation in dimensional precision compared with one-shot drawing patterns (portion (a) of FIG. 31), there is also a difference between the average measured resist dimension and the design dimension (Wd). This difference to the average is due to irradiation using a fine electron beam.

The size of the fine drawing data at which deterioration in dimensional precision becomes severe is generally 0.5 $\mu$m or less, although this is largely dependent upon the electron beam drawing apparatus used, the type of resist, the type of pattern formation process, and conditions.

Unless otherwise specified below, "fine drawing data" hereinafter refers to drawing data of which the drawing pattern width is less than the critical dimension at which dimensional precision deteriorates, and is drawing data affecting the dimensional precision of the resist pattern, i.e., is drawing data positioned at the edge components of the resist pattern.

Considering the problem of resist pattern dimensions deteriorating as a result of how the electron beam drawing data is divided, the present invention relates to a method for generating electron beam drawing data such that areas in which high dimensional precision is required can be drawn using one-shot electron beam irradiation insofar as possible, and further minimizing the generation of fine drawing data when drawing is only possible by means of plural shots.

Note that if unnecessary divisions and fine drawing data can be reduced by a pattern data generating method, it is also possible to shorten the drawing time as a result of reducing the drawing data.

The drawing data generator and generating method of a variable output electron beam drawing apparatus according to the prior art are described next below with reference to the data processing flow chart shown in FIG. 35.

First, the overlaps eliminating function of the drawing data generator removes overlapping areas between shapes in the circuit layout design data. This is required to prevent double exposure of the same area by the electron beam, and is a process required in the generation of drawing data for a variable output electron beam drawing apparatus.

This overlaps eliminating process has particular significance to the background of the present invention, and is therefore described below.

Overlapping areas can be eliminated by various means, one of the most common methods being the so-called "slab method." This slab method is described below with reference to FIGS. 36A and 36B.

First, dividing lines are inserted from each vertex of each shape in a predetermined direction (horizontal or vertical) throughout the process area, and the process area is then divided into long, narrow rectangular areas ("slabs"). Next, each shape is further divided at the slab boundaries. In FIGS. 36A and 36B the shapes are divided horizontally.

The direction of each side of the divided shapes is then determined to extract the vectors. The vectors are determined by tracing clockwise or counterclockwise from each vertex along the corresponding sides.

A vector value indicating the orientation of each vector in the slab is then assigned. For example, when the slabs are formed horizontally as shown in FIGS. 36A and 36B, vectors oriented from the bottom side towards the top side of the slab are assigned a "1", and vectors oriented from the top to the bottom side of the slab are assigned a "−1". The result of this operation applied to a clockwise trace of each vertex is shown in FIG. 36A.

The next step is removing the overlapping areas. A method for accomplishing this is described below.

The first step is to sort all vectors contained in each slab for each slab based on the coordinates of the contact between each vector and the bottom side of the slab.

Next, the vector orientation values assigned to each vector are added, in sequence from the left when the slabs are formed horizontally, to find the vectors for which the sum of vector orientation values is zero (0). The basic shapes are formed by the vector from which adding started and the vector with which the sum of vector orientation values is zero (0).

This is described below with reference to slab 7 in FIG. 36A. Vector orientation value summing starts from the vector at the left edge. The vector orientation value sum of this first vector and the second vector is 2, 1 with the third vector, and 0 with the fourth vector. One basic shape is therefore defined by the left vector and the fourth vector in slab 7, and vectors 2 and 3 are deleted as unnecessary vectors. The result of this operation applied to all slabs and vectors in FIG. 36A is shown in FIG. 36B.

By applying this process to the vectors in all slabs, all overlapping between shapes is removed, and the resulting process data can be divided into basic geometric shapes. This method can also be executed at high speed, and is therefore also suited to processing large volumes of pattern data.

The problem with this method, however, is that the areas requiring high dimensional precision are divided into plural drawing data areas, i.e., fine drawing data is frequently generated.

The process for eliminating overlapping branches as shown in FIG. 35 is dependent upon the type of resist (positive or negative) and the design method used for the layout.

If the electron beam must be irradiated to an area outside the range of the layout data input for the design, an image inversion process is required. This inversion process can also be processed by the same method used for the overlap elimination process described above. A specific method used for the shape inversion process is described below with reference to FIGS. 37A and 37B.

The process eliminating overlapping is executed to eliminate overlapping and extract the side vectors for the remaining image areas. The area (frame) to be inverted is then set, the shape (rectangle) corresponding to this frame is then divided at the slab borders, and a vector orientation value is assigned to each vector (as in the overlap elimination process). The orientation of each vector of each shape contained in the inversion area is then inverted, i.e., the sign of each vector orientation value is reversed. The result of this operation is shown in FIG. 37A.

The subsequent process is the same as that in the overlaps eliminating process: vector pairs are found by adding the vector orientation values located on the frame of the inversion area to extract the basic shapes. The result of the inversion process is shown in FIG. 37B.

As with the overlaps eliminating process, the problem with the inversion process is that the areas requiring high dimensional precision are divided into plural drawing data areas, i.e., fine drawing data is frequently generated.

To resolve this problem it is possible to redefine the shapes divided into basic shapes as a series of polygons after the overlaps eliminating process, and then redivide the resulting polygons one by one. The process for this is also shown in FIG. 35.

This process cannot, however, be applied when inversion is also necessary. This is because redefining the group of inverted shapes as a polygon will result in one large polygon of plural connected shapes having a large number of vertices, which effectively prohibits the process dividing the polygon into basic component shapes from being executed with an acceptable degree of efficiency.

When inversion processing is therefore not required, the present invention provides a method of dividing the pattern data into basic shapes whereby areas requiring high dimensional precision are not divided into plural drawing regions, and the frequency of fine drawing data is minimized, as much as possible.

When inversion processing is not required, a method whereby the process area is redefined by polygons after the overlap elimination process, and the polygons are then redivided into basic geometric shapes, is used.

The prior art method of dividing a polygon into basic geometric shapes is described below with reference to FIG. 38.

This division method is similar to the overlaps eliminating process (FIGS. 36A and 36B): each side is converted to a vector, and the vector pairs defining the basic shapes are detected. What differs is that while the overlaps eliminating process processes the entire image area at one time, the basic shape division method is executed individually for each of the polygons.

The method illustrated in FIG. 38 requires a simple algorithm and can be executed at high speed. On the other hand, there is no provision made to prevent dividing the areas requiring high dimensional precision into plural drawing regions, or for minimizing the frequency of fine drawing data.

The basic shape dividing method invented to resolve this problem is described below with reference to FIG. 39 as the prior art.

This dividing method is identical to the method for dividing polygons into basic geometric shapes described above with respect to FIG. 38 except that the direction (vertical or horizontal) in which the polygon is divided can be selected for each polygon in the design data.

The control procedure is therefore similarly simple: each polygon is divided vertically or horizontally into component shape elements, and the total aspect ratio (long side/short side) of all basic shapes is calculated based on the result of polygon division. The polygon division results having a small aspect ratio sum are then selected and output.

While relatively simple, this method produces less than 1/10 of the fine drawing data resulting from the conventional method, offers acceptable throughput in manufacturing environments, and has been proven in the actual production of semiconductor devices.

However, this method is also not specifically intended to prevent dividing the areas requiring high dimensional precision into plural drawing regions, or to minimize the frequency of fine drawing data, and is effective only when the direction of polygon division is appropriately selected according to the characteristics of the layout pattern of the semiconductor device. This method is also particularly effective when applied to memory devices and other devices having a regular layout pattern. However, when the layout pattern has many random components, such as occurs in logic devices, this method can often not be used.

Variable output electron beam formation methods are expected to be the mainstream in direct electron beam drawing methods used for device development in the future. The problem with variable output beam drawing methods is that pattern overlap elimination processing and inversion processing are required when generating the drawing data from the circuit layout design data, and the time required to generate the drawing data is therefore longer than that required by conventional raster scan methods.

More specifically, however, the basic polygon data defining the circuit layout design data must be separated into the basic geometric shapes (trapezoids, rectangles, squares, triangles) that can be drawn by the electron beam drawing apparatus (this process is referred to as "basic shape separation" below) in order to draw the circuit layout design data with a variable output electron beam drawing apparatus. The problem is that the dimensional precision of the resist pattern formed after electron beam drawing will vary according to how the basic shape separation process is applied.

SUMMARY OF THE INVENTION

Therefore, the present invention provides a method and an apparatus for generating the drawing data of an electron beam drawing apparatus at high speed and with high precision from the circuit layout design data of a semiconductor device.

As a result of significant research, the inventors discovered that a drawing data generating apparatus can achieve the aforementioned objects by comprising a function for automatically correcting chamfer members, a function for separating triangles, an automatic critical dimensions extraction function, an automatic critical dimensions area separation function, a basic shape division function, and a fine drawing data editing function.

More specifically, the present invention is a drawing data generating method comprising an automatic critical dimensions (CD) area separating process for pre-separating the critical dimensions areas requiring high dimensional precision.

This automatic critical dimensions (CD) area separating process may be a method for detecting the sides internal to each polygon, and not using these internal sides as candidate sides for critical dimensions area extraction; a method for interrupting the critical dimensions area separation process when fine drawing data is generated as a result of critical dimensions area separation; a method that is able to define plural critical dimensions values; or a method that is able to define plural critical dimensions values and a priority sequence for the plural critical dimensions values.

The charged beam pattern data generating method of the present invention may further comprise a process for scanning the polygon widths to automatically extract the critical dimensions; and a process for inputting the extracted critical dimensions to the automatic critical dimensions (CD) area separating process.

The charged beam pattern data generating method of the present invention may further comprise a triangle separation process for pre-separating the right triangle components from the polygons, and particularly a triangle separation process which during right triangle separation does not separate triangles having a slightly sloping side.

The charged beam pattern data generating method of the present invention may comprise a basic geometric shape separation process for selecting the best separation results based on a predetermined evaluation standard from among the plural separation results formed by sequentially inserting dividing lines from each vertex of the polygon.

This basic geometric shape separation process may particularly comprise: a process for selecting the separation results of which the sum of the lengths of the long sides (hereinafter the "representative sides") of the fine drawing data affecting the dimensional precision of the pattern is smallest; a process for calculating for the separation results the lengths of the representative sides of the fine drawing data affecting the dimensional precision of the resist pattern for each combination of dividing lines during dividing line insertion, and selecting the separation results for which the calculated value is smallest; a process for not inserting a dividing line when dividing line insertion will create fine drawing data; a process for not inserting a dividing line when dividing line insertion will divide a critical dimensions area; or a process for, after inserting all insertable dividing lines inside each polygon, defining a cost for each dividing line producing fine drawing data or dividing a critical dimensions area, sequentially extracting the dividing lines for which the sum of said cost and the length of the dividing line is smallest, and separating the basic geometric shapes formed by this dividing line side and the sides of the polygon.

The charged beam pattern data generating method of the present invention may further comprise a fine drawing data editing process for editing a manual process fine drawing data that could not be processed by the basic geometric shape separation process.

The charged beam pattern data generating method of the present invention may further comprise an automatic chamfer member editing process for suppressing the generation of fine drawing data by deleting or revising unnecessary chamfered members.

The charged beam pattern data generating method of the present invention may further comprise an automatic chamfer member editing process for suppressing the generation of fine drawing data by revising slightly inclined sides that are not chamfered members, or revising slightly inclined sides that are not chamfered members by generating a new side bisecting the area of the triangle formed by said slightly inclined side.

The automatic chamfer member editing process of the present invention may furthermore revise slightly inclined sides that are not chamfered members by generating a new side after referencing, for each slightly inclined side to determine whether a new side should be generated, results obtained by simulation or experimentation. The parameters used for referencing these results include the length of the slightly inclined side, the angle formed by said slightly inclined side and a second side connecting thereto, and which side of the slightly inclined side is to be drawn by the electron beam.

The charged beam pattern data generating method of the present invention may further execute the triangle separation process after the automatic chamfer member editing process.

A charged beam pattern data generating apparatus according to the present invention may comprise an automatic critical dimensions (CD) area separating means for pre-separating the critical dimensions areas requiring high dimensional precision; a triangle separation means for pre-separating the right triangle components from the polygons; an automatic critical dimensions extraction means for scanning the polygon widths to automatically extract the critical dimensions, and a means for inputting the extracted critical dimensions to the automatic critical dimensions (CD) area separating function; a basic geometric shape separation means for selecting the best separation results based on a predetermined evaluation standard from among the plural separation results formed by sequentially inserting dividing lines from each vertex of the polygon; a fine drawing data editing means for editing using manual process fine drawing data that could not be processed by the basic geometric shape separation process; an automatic chamfer member editing means for suppressing the generation of fine drawing data by deleting or revising unnecessary chamfered members; and/or an automatic chamfer member editing means for suppressing the generation of fine drawing data by revising slightly inclined sides that are not chamfered members.

By means of the present invention thus described, it is possible to not generate fine drawing data and to draw a high precision pattern by executing the automatic critical dimensions (CD) area separating process for pre-separating the critical dimensions areas requiring high dimensional precision (see FIG. 2 and FIGS. 3A to 3D).

In particular, it is possible to prevent areas that are not a critical dimensions area from being extracted as a critical dimensions area, and more accurate critical dimensions area extraction is therefore possible, by detecting the internal sides of each polygon in the automatic critical dimensions (CD) area separating process, and not using these internal sides as candidate sides forming the critical dimensions area (see FIG. 4).

In addition, it is possible to avoid creating fine drawing data as a result of critical dimensions area extraction, and it is thereby possible to create drawing data of high quality, by interrupting the critical dimensions area separation process when fine drawing data is generated as a result of critical dimensions area separation in the automatic critical dimensions (CD) area separating process (see FIGS. 5A and 5B and FIGS. 6A to 6C).

It is furthermore possible to separate critical dimensions areas of different dimensions (see FIGS. 7A and 7B) by defining plural critical dimensions values in the automatic critical dimensions (CD) area separating process, and to separate the critical dimensions areas in order of importance by assigning a priority value to each of the plural critical dimensions values (see FIGS. 8A and 8B), resulting in drawing data of even higher quality.

The critical dimensions values can also be extracted and separated easily and accurately by executing both a process for scanning the polygon widths to automatically extract the critical dimensions, and a process for inputting the extracted critical dimensions to the automatic critical dimensions (CD) area separating function.

By executing a triangle separation process for pre-separating the right triangle components from the polygons before the critical dimensions (CD) area separating process, the occurrence of fine drawing data can be significantly reduced while pattern dimensions also improve, thereby significantly reducing the drawing time (see FIG. 9 and FIGS. 10A to 10D).

It should be noted that the triangle separation process preferably does not separate triangles having a slightly sloping side during right triangle separation.

High quality drawing data can also be generated by means of the present invention by executing a basic geometric shape separation process for selecting the best separation results based on a predetermined evaluation standard from among the plural separation results formed by sequentially inserting dividing lines from each vertex of the polygon.

The method of selecting the best separation results is preferably a method for selecting the separation results of which the sum of the lengths of the representative sides of the fine drawing data affecting the dimensional precision of the pattern is smallest (see FIGS. 13 and 14); a method for calculating for the separation results the lengths of the representative sides of the fine drawing data affecting the dimensional precision of the resist pattern for each combination of dividing lines during dividing line insertion, and selecting the separation results for which the calculated value is smallest (see FIG. 15); a method for not inserting a dividing line when dividing line insertion will create fine drawing data (see FIG. 16); a method for not inserting a dividing line when dividing line insertion will divide a critical dimensions area (see FIGS. 17A to 17C); or a method for, after inserting all insertable dividing lines inside each polygon, defining a cost for each dividing line producing fine drawing data or dividing a critical dimensions area, sequentially extracting the dividing lines for which the sum of said cost and the length of the dividing line is smallest, and separating the basic geometric shapes formed by this dividing line side and the sides of the polygon (see FIG. 28 and FIGS. 29A and 29B).

It is also possible to avoid creating fine drawing data that cannot be processed by the automatic basic geometric shape separation process, and it is thereby possible to generate high quality drawing data, by executing a fine drawing data editing process for editing by means of a manual process fine drawing data that could not be processed by the basic geometric shape separation process (see FIG. 18).

It is also possible to suppress the generation of fine drawing data resulting from unnecessary chamfers, and to improve the dimensional precision of the pattern, by executing an automatic chamfer member editing process for suppressing the generation of fine drawing data by deleting or revising unnecessary chamfered members (see FIGS. 19A to 19C and FIG. 20).

By also applying said automatic editing process to slightly inclined sides that are not chamfered members, the generation of fine drawing data can be further suppressed and the dimensional precision of the pattern can be improved (see FIGS. 21A and 21B and FIG. 22).

Note that the automatic editing process can be achieved whereby a new side bisecting the area of the triangle unit formed by the slightly inclined side is generated to revise slightly inclined sides that are not chamfered members (see FIG. 23 and FIGS. 24A to 24C); or whereby whether a new side should be generated is determined for each slightly inclined side by referencing results obtained by simulation or experimentation. The parameters used for referencing these results include the length of the slightly inclined side, the angle formed by the slightly inclined side and a second side connecting thereto, and which side of the slightly inclined side (inside or outside the polygon) is to be drawn by the electron beam. A new side is generated dependent upon the result obtained with these parameters (see FIG. 25).

It is possible to avoid generating fine drawing data that cannot be edited, and it is thereby possible to generate high quality drawing data, by executing the triangle separation process after the automatic chamfer member editing process (see FIGS. 26A to 26C).

A charged beam pattern data generating apparatus according to the present invention can also provide high quality drawing data by comprising an automatic critical dimensions (CD) area separating means for pre-separating the critical dimensions areas requiring high dimensional precision; a triangle separation means for pre-separating the right triangle components from the polygons; an automatic critical dimensions extraction means for scanning the polygon widths to automatically extract the critical dimensions, and a means for inputting the extracted critical dimensions to the automatic critical dimensions (CD) area separating function; a basic geometric shape separation means for selecting the best separation results based on a predetermined evaluation standard from among the plural separation results formed by sequentially inserting dividing lines from each vertex of the polygon; a fine drawing data editing means for editing by means of a manual process fine drawing data that could not be processed by the basic geometric shape separation process; an automatic chamfer member editing means for suppressing the generation of fine drawing data by deleting or revising unnecessary chamfered members; and/or an automatic chamfer member editing means for suppressing the generation of fine drawing data by revising slightly inclined sides that are not chamfered members (see FIG. 1).

BRIEF DESCRIPTION OF THE DRAWINGS

The present invention will become more fully understood from the detailed description given below and the accompanying diagrams wherein:

FIGS. 2, 4, 5A–5B, 7A–7B, and 8A–8B are flow charts of the automatic critical dimensions (CD) area separating function according to preferred embodiments of the present invention;

FIGS. 13, 15, 16 and 17A–17C are flow charts of the basic geometric shape separation function according to preferred embodiments of the present invention;

FIG. 14 is used to describe a specific application of the basic geometric shape separation function according to a preferred embodiment of the present invention;

FIGS. 20, 22, 23 and 25 are flow charts of the automatic chamfer member editing function according to preferred embodiments of the present invention;

FIG. 27 is a flow chart of the triangle separation function according to a preferred embodiment of the present invention;

FIG. 32 is a graph of the relationship between the drawing data and the electron beam power distribution;

FIG. 33 is a graph of the relationship between the drawing data and the electron beam power distribution when fine drawing data areas are contained in the circuit layout;

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF PREFERRED EMBODIMENTS (Embodiment 1)

The preferred embodiment of the critical dimensions (CD) area separating function that is one of the functions of a drawing data generating apparatus 10 according to the present invention is described first below.

The manufacturing process for semiconductor devices may comprise various intermediate processes, including a circuit element separation process, transistor gate manufacturing process, wiring process, and memory capacity manufacturing process. Large-scale integration is commonly achieved in each of these and other processes by designing the pattern width and gap between patterns to the smallest dimension achievable by the semiconductor manufacturing process used. These processes also have a significant effect on the electrical characteristics of the semiconductor device, and require higher dimensional precision than other patterns. Patterns requiring such high precision are referred to in the present invention as "critical dimension patterns," or "CD patterns" below.

As described in the discussion of the prior art above, these CD patterns can be formed with high precision when one-shot electron beam drawing is possible. The prior art, however, does not actively address these CD patterns, and only passively increases the probability of dividing a CD pattern and drawing the CD pattern with plural shot electron beam drawing by selecting the direction for basic geometric shape separation.

With such passive methods, however, the quality of the separation result is greatly dependent upon the pattern layout. More specifically, results are good when identical patterns are created in an ordered array, as occurs in memory devices, but the effectiveness of this drawing data generation method deteriorates when applied to logic devices having greater randomness in the circuit layout.

Figure 1:
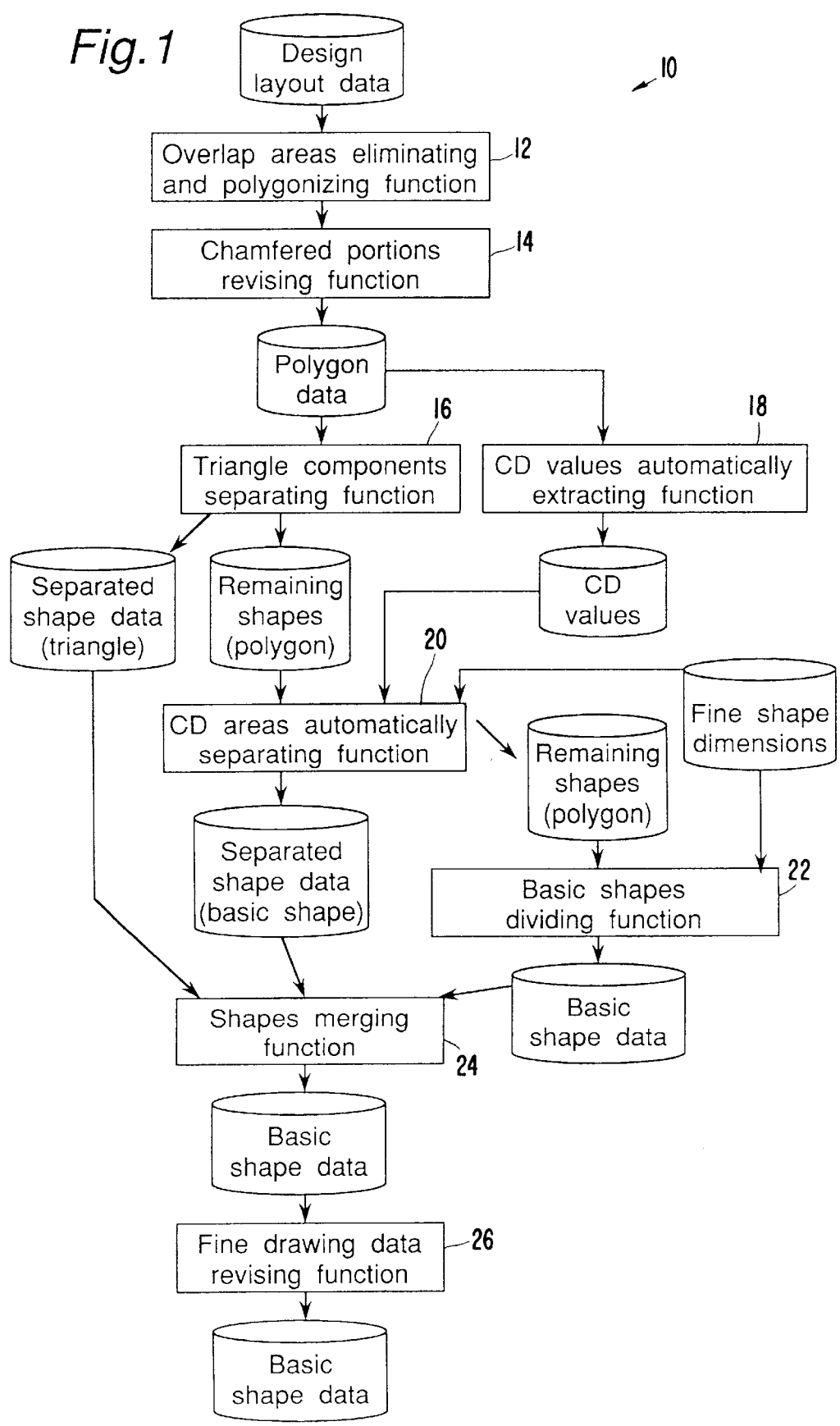
FIG. 1 is a block diagram of the overall drawing data generating apparatus according to the present invention.

The critical dimensions (CD) area separating function 20 according to the present embodiment of the invention specifically addresses this problem by being executed before the basic geometric shape separation process 22 in the drawing data generating apparatus 10 of the present invention, as shown in FIG. 1.

It is to be noted that the critical dimensions (CD) area separating function 20 of the invention is not dependent upon the overall structure of the drawing data generating apparatus 10 of the invention, and can be added as an adjunct function to a drawing data generating apparatus according to the prior art.

The CD area separating function 20 of the invention automatically extracts the areas (CD areas) matches predefined CD pattern dimensions (CD value) in each input polygon, and then separates these areas from the polygon.

This CD area separating function 20 makes it possible to prioritize separation of the CD areas requiring high dimensional precision before separation of the basic geometric shapes. It is thereby possible to draw the CD areas with a one-shot electron beam, and high precision pattern formation is thus possible. Unlike the methods of the prior art, the method of the present invention is not a passive method. As a result, the separation results are also not greatly dependent upon the pattern layout.

Figure 2:
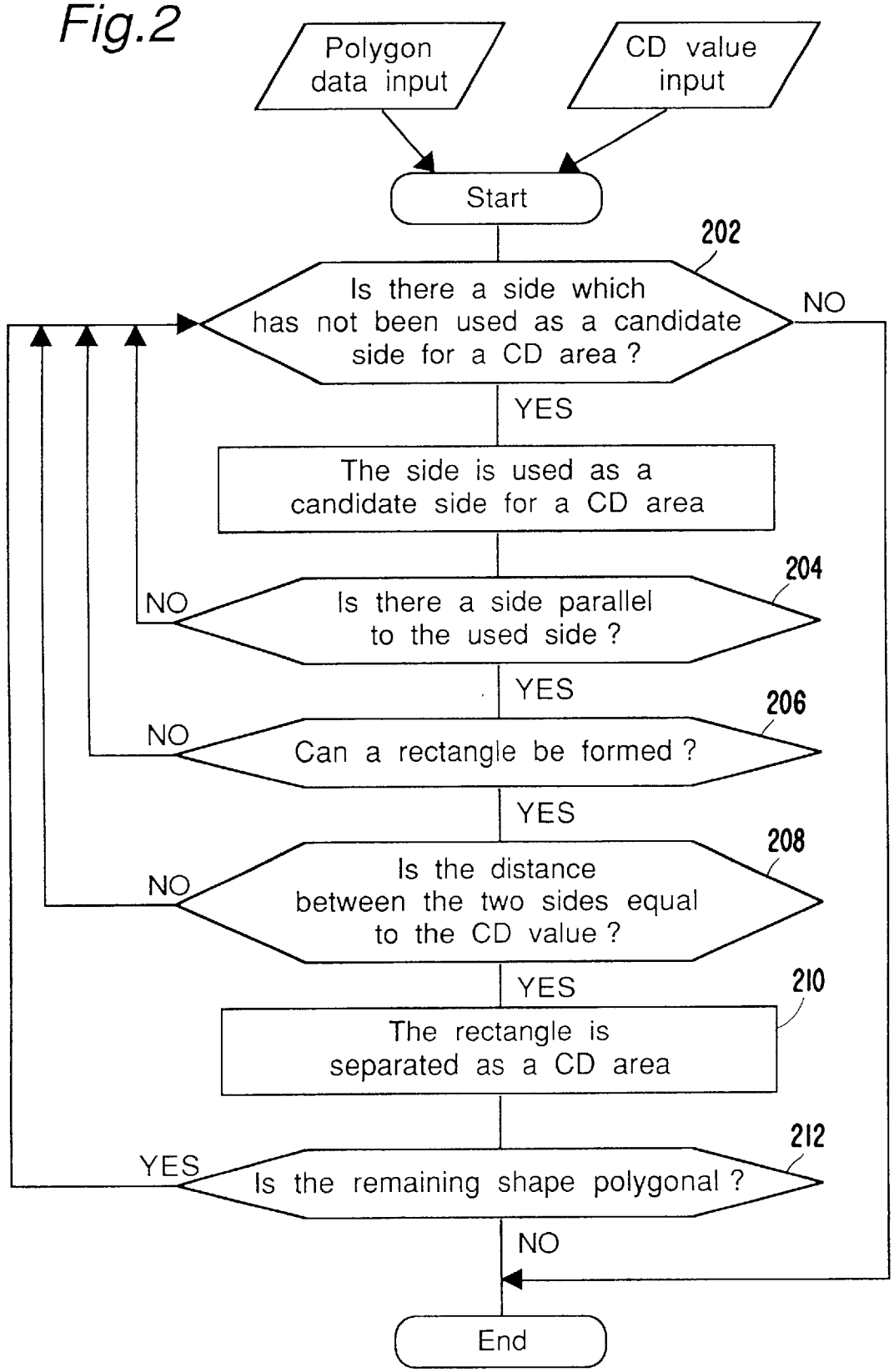

A specific flow chart for this process is shown in FIG. 2. Each side of each polygon is sequentially defined as a candidate side forming a CD area (202), and a side parallel to the candidate side is then searched for (204). If a parallel side is found, it is determined whether a rectangle can be formed using these two sides (206). If a rectangle can be formed, the width of the rectangle is compared with the preset CD value. If the rectangle width and CD value are equal (208), the rectangle is separated as a CD area (210).

This CD area separation process is repeated until either all CD areas have been separated, or the shape remaining after CD area separation is not a polygon (212).

Figure 3A:
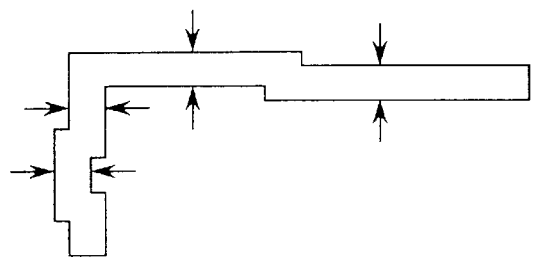
FIGS. 3A–3D and 6A–6C illustrate a specific application of the automatic critical dimensions (CD) area separating function according to preferred embodiments of the present invention.
Figure 3B:
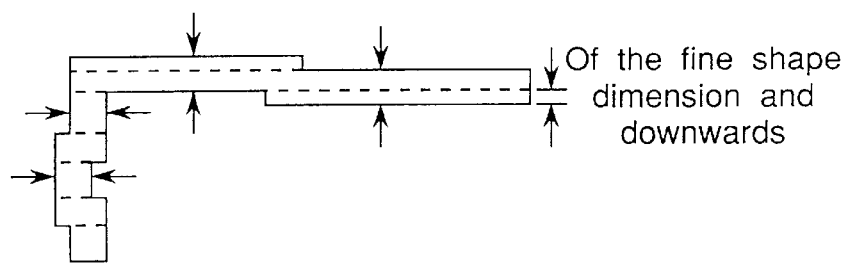
Figure 3C:
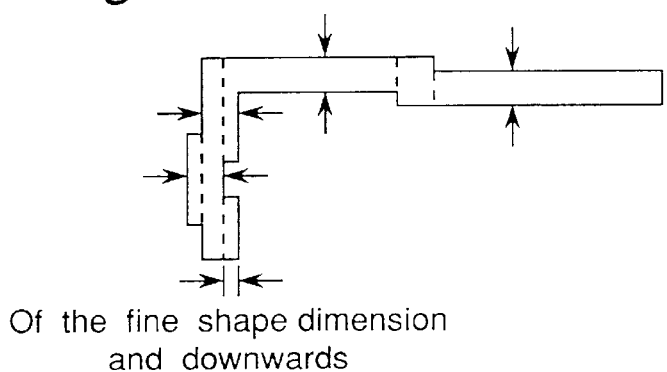
Figure 3D:
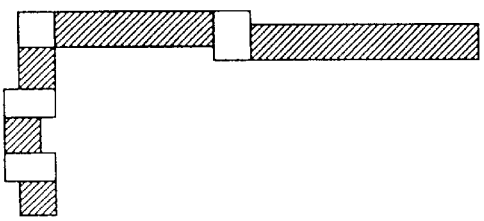

A specific example of this process is described below with reference to FIGS. 3A to 3D, of which FIG. 3A shows the input polygon, FIGS. 3B and 3C show the results of separation horizontally and vertically, and FIG. 3D shows the result of CD area separation. Note that the pattern widths indicated by the arrows in FIGS. 3A to 3C are the areas corresponding to the CD value.

As shown by FIGS. 3B and 3C, it is not possible to avoid dividing CD areas or creating fine drawing data using the conventional method of simply selecting the direction of polygon separation.

By means of the automatic critical dimensions (CD) area separating function of the present invention, however, the CD areas ( shown as the shaded areas in FIG. 3D ) can first be separated before the basic geometric shape separation process. Fine drawing data is therefore not generated in the CD areas by the separation process, and high precision pattern formation becomes possible.

(Embodiment 2)

The preferred method of extracting the CD areas with greater accuracy is described below as a second embodiment of the automatic critical dimensions (CD) area separating process of the invention.

In the CD area separating process according to the first embodiment above, the CD areas are successively separated from the polygon, and this process may create sides that should be inside the polygon. If these internal sides are used as candidates for CD area extraction, areas that are not actually CD areas may be falsely separated as CD areas.

Figure 4:
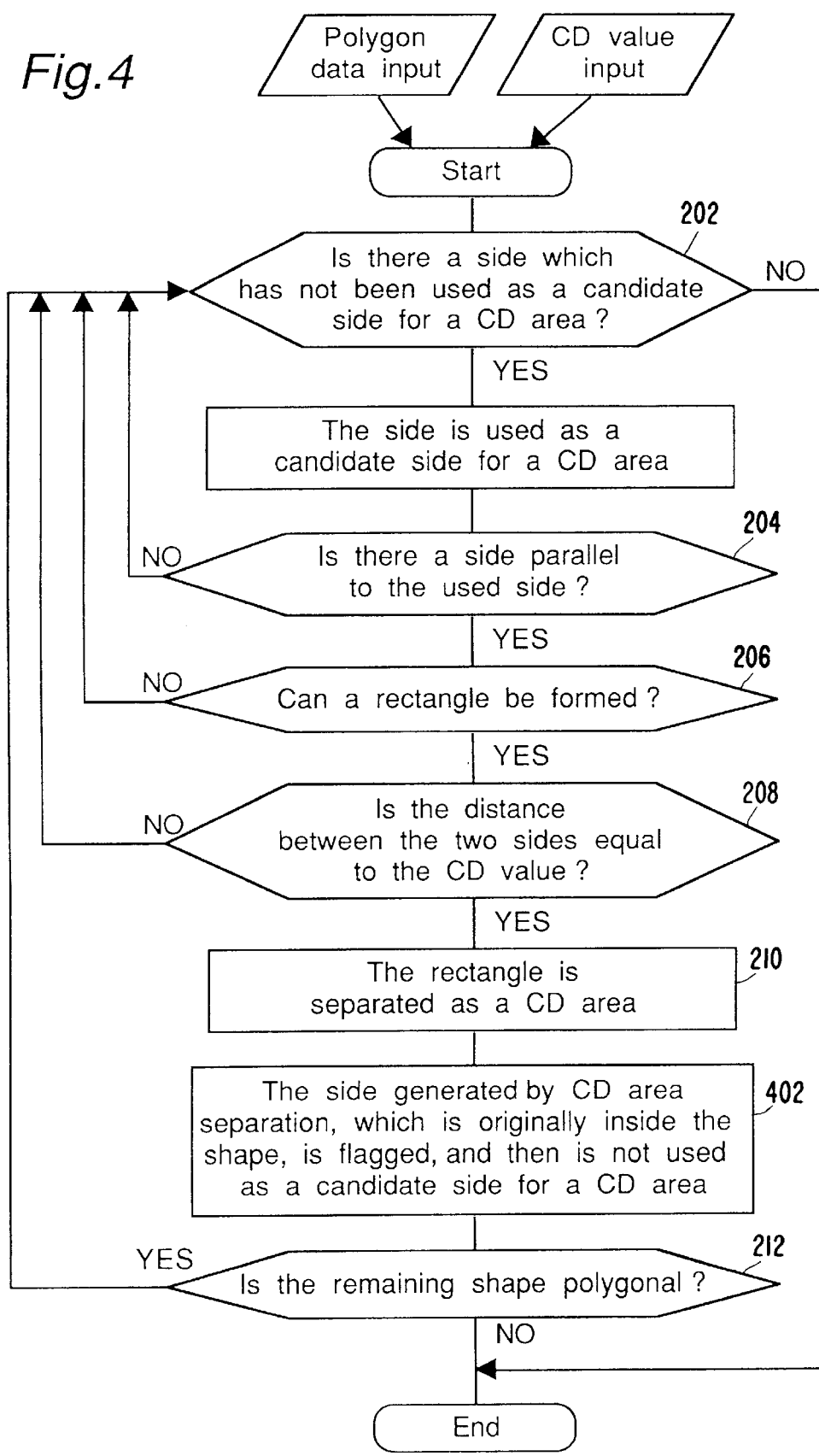

The second embodiment is therefore a critical dimensions (CD) area extraction process whereby sides that do not directly affect the dimensional precision of the pattern are flagged and thereafter not used as candidate sides forming the CD areas (402). A flow chart of this process is shown in FIG. 4.

It is possible by means of the critical dimensions (CD) area extraction process of the second embodiment to extract the CD areas with greater accuracy.

(Embodiment 3)

The third embodiment of the present invention relates to a critical dimensions (CD) area separating process for interrupting the separation of a critical dimensions area causing the creation of a fine drawing data area when fine drawing data is generated as a result of critical dimensions area separation.

Figure 5B:
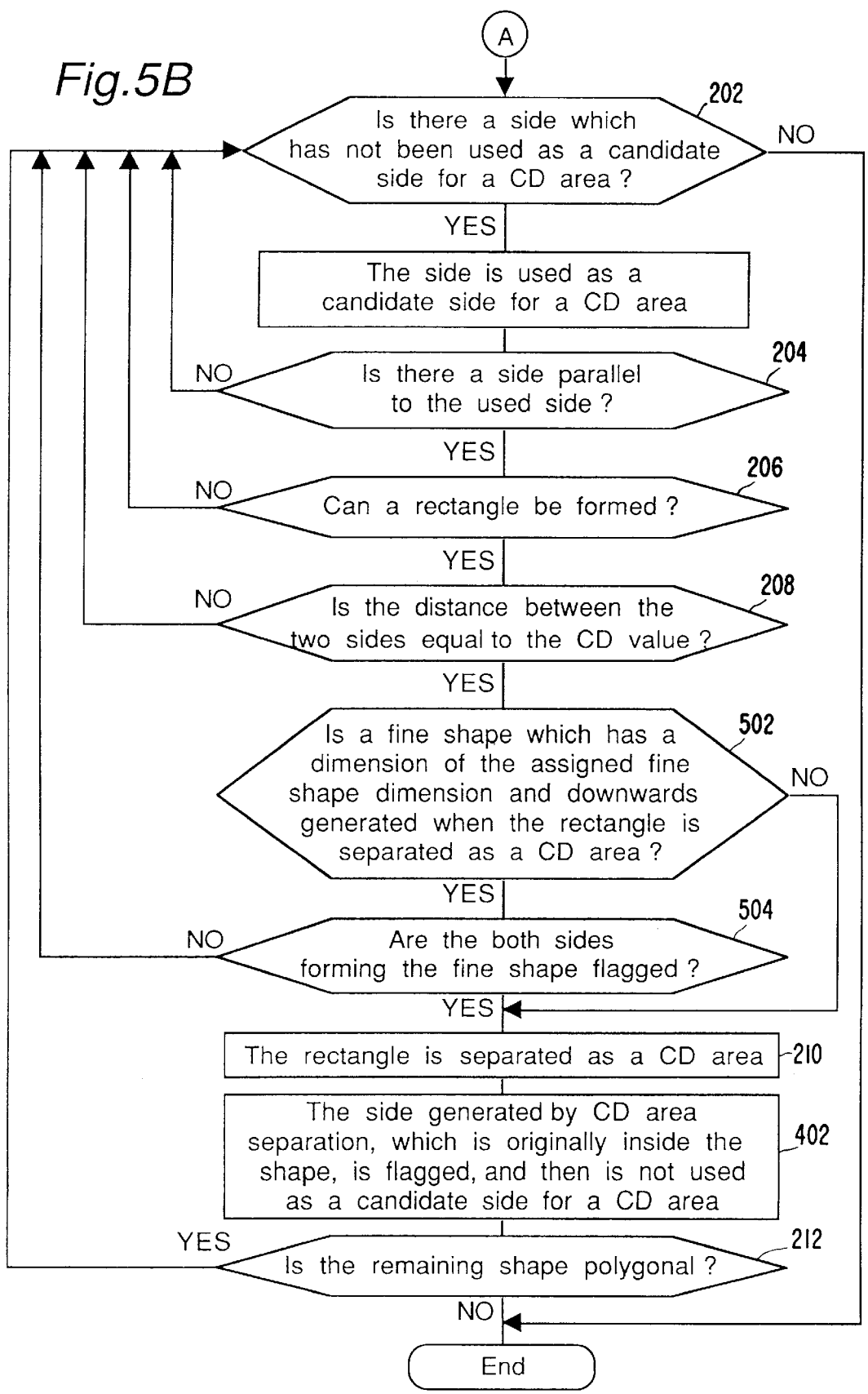

A flow chart of this process is shown in FIGS. 5A and 5B.

This embodiment is characterized by stopping separation of a critical dimensions area when separation of that CD area will create a shape of narrow width (a fine drawing data area) that will result in reduced precision in the pattern dimensions (502 and 504).

The method described as the second embodiment above is used to determine whether a shape of narrow width created by CD area separation is a fine drawing data area that will result in degraded dimensional precision in the resist pattern. Specifically, any side for which the flag has been set is a side that is inside the original shape (polygon). As a result, shapes of narrow width formed by two sides for which the flag is set can be determined to not be fine drawing data degrading dimensional precision in the resist pattern.

A specific example is described below with reference to FIGS. 6A to 6C.

Figure 6A:
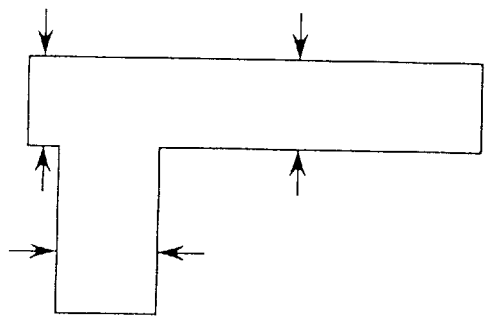
Figure 6B:
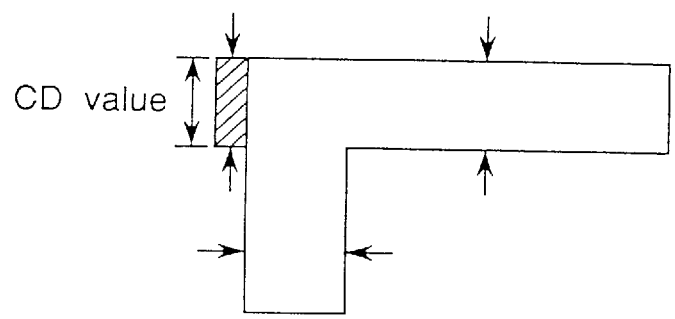
Figure 6C:
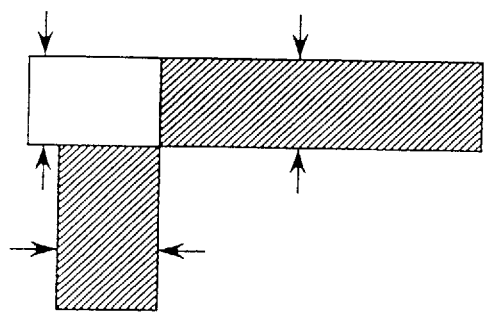

The CD areas are the sections indicated by the arrows in FIG. 6A. When the shaded CD area shown in FIG. 6 B is separated, the separated shape becomes a fine drawing data area. In this case, separation of the shaded CD area is stopped, and the process continues to separate the other CD areas. If the hatched areas only are extracted as CD areas, good separation results as shown in FIG. 6C can be obtained.

It is therefore possible by means of the present invention to avoid creating fine drawing data as a result of CD area separation, and to thereby generate higher quality drawing data.

(Embodiment 4)

The fourth embodiment of the present invention relates to a CD area separating process as described above characterized by setting plural critical dimensions (CD) values rather than only one CD value defining the CD areas (702).

Figure 7B:
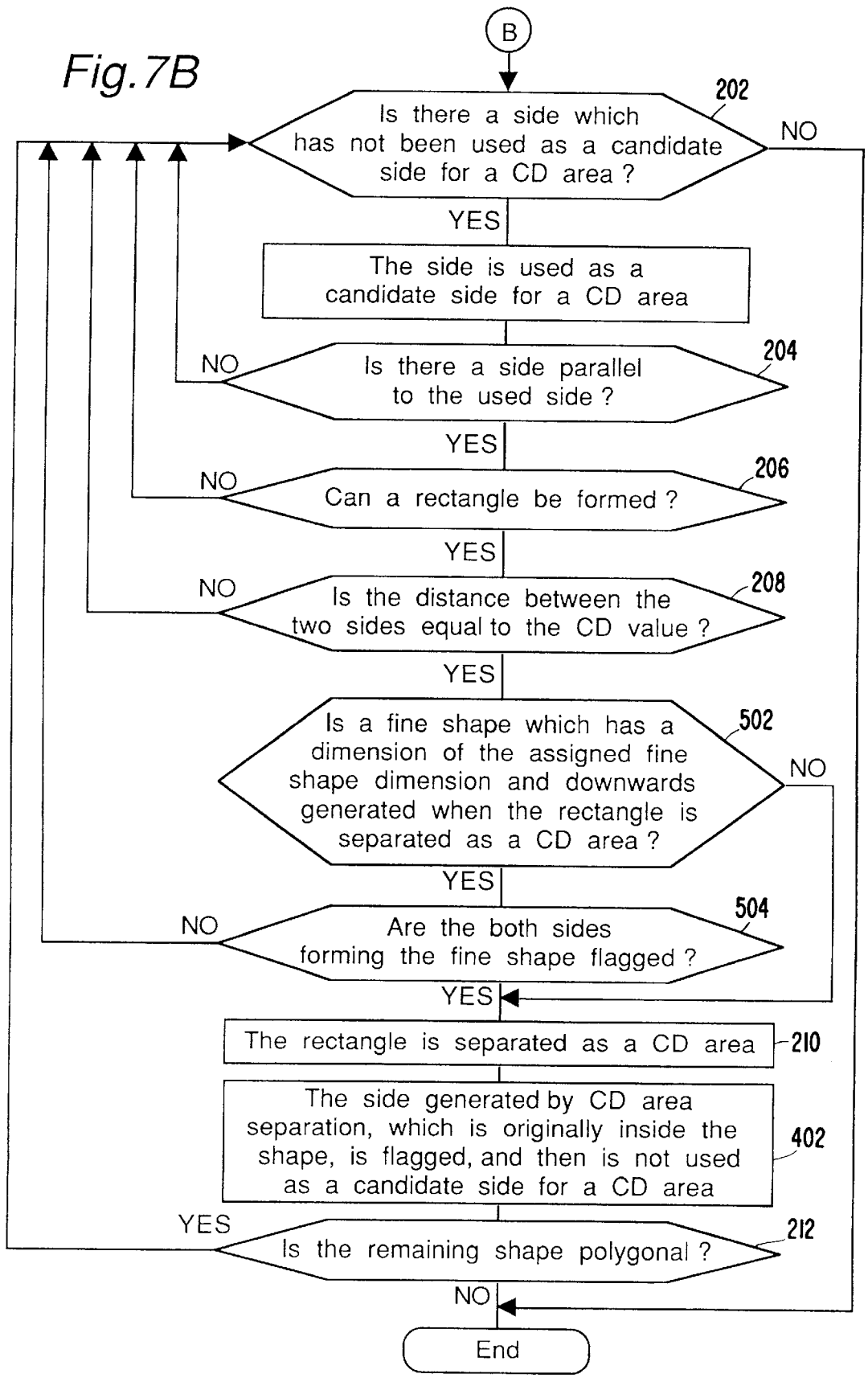

A flow chart of this process is shown in FIGS. 7A and 7B.

By defining plural critical dimensions values rather than only one CD value defining the CD areas, it is possible to separate CD areas of different dimensions, and thereby create drawing data of even higher quality.

(Embodiment 5)

The fifth embodiment of the present invention relates to a CD area separating process setting plural critical dimensions (CD) values further characterized by assigning a priority value to each of the plural CD values (802).

A flow chart of this process is shown in FIGS. 8A and 8B.

By assigning a priority value to each of the plural defined CD values to separate the critical dimensions areas in order of greatest importance first, it is possible to create drawing data of even higher quality.

(Embodiment 6)

The sixth embodiment of the present invention relates to a triangle separation function for generating even higher quality drawing data by separating triangle components from the polygons before the critical dimensions (CD) area separating process.

As shown in FIG. 1, this triangle separation function 16 is provided before the critical dimensions (CD) area separating process in the drawing data generating apparatus 10 of the invention. It is to be noted that, like the critical dimensions (CD) area separating function 20, this triangle separation function 16 is not dependent upon the overall structure of the drawing data generating apparatus 10 of the invention, and can be added as an adjunct function to a drawing data generating apparatus according to the prior art.

Figure 9:
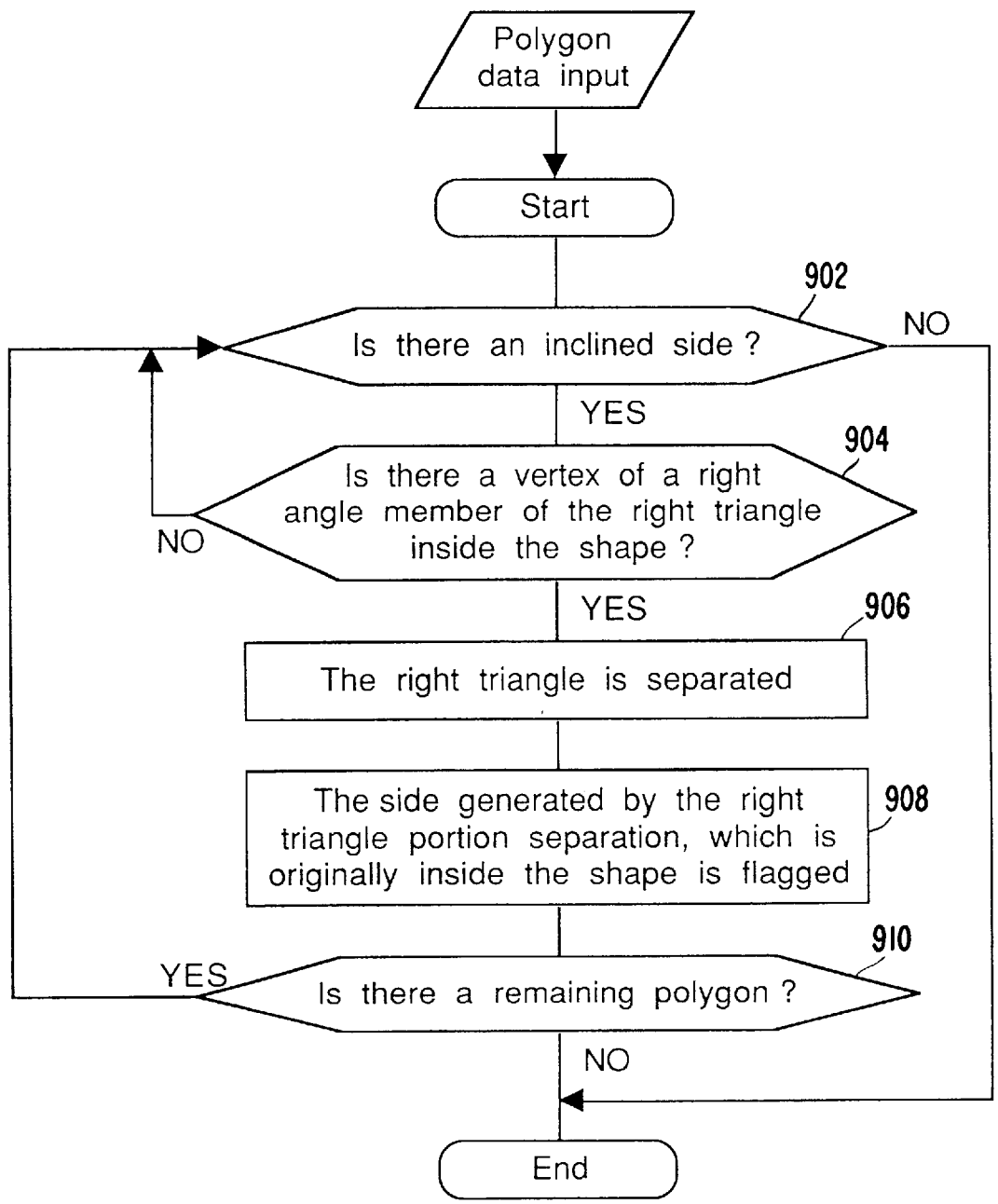
FIG. 9 is a flow chart of the triangle separation function according to a preferred embodiment of the present invention.

A flow chart of this process is shown in FIG. 9.

The first step is to locate any sides having a slope between zero (0) and ninety (90) degrees, and to then determine whether a right triangle can be formed using the detected inclined side as one side of the triangle (902 and 904). If the right angle member of the detected right triangle is inside the polygon, that right triangle is extracted. Separation of such right triangles will create a new side. If the new side is inside the original shape (polygon), a flag identifying the internal side is set (908). Note that this flag has the same function as the flag described in the second embodiment above. If the shape remaining after right triangle extraction is a polygon (910), right triangle separation is repeated for the remaining polygon.

Figure 10A:
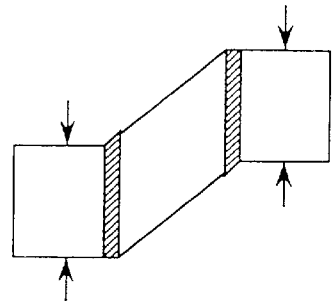
FIGS. 10A–10D are used to describe a specific application of the triangle separation function according to a preferred embodiment of the present invention.
Figure 10B:
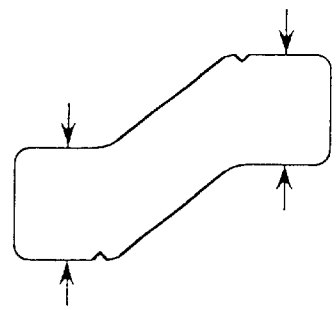

FIG. 10A shows the results of CD area separation without first extracting right triangles. Note that the areas indicated by the arrows are CD areas. As shown in FIG. 10A, fine drawing data, indicated as the shaded area, results after CD area separation. When the resist pattern is formed by electron beam drawing using these drawing shapes, pattern deformation occurs at the points indicated by the arrows in FIG. 10B, and the deterioration in pattern precision is obvious.

Figure 10C:
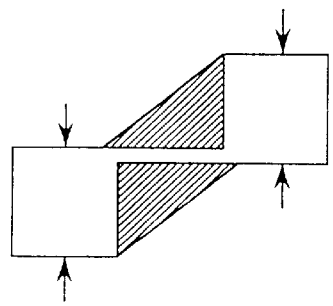
Figure 10D:
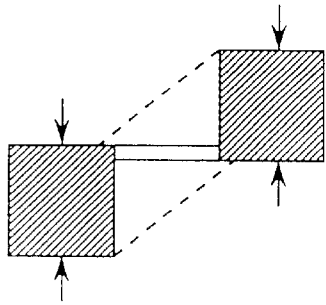

When the right triangles are first extracted and the CD areas are then separated, however, fine drawing data as shown in FIG. 10A does not occur, and a good resist pattern can be formed as shown in FIGS. 10C and 10D.

It is to be noted that the narrow channel joining the two CD areas as shown in FIG. 10D is inside the original pattern, and therefore does not affect the dimensional precision of the resist pattern.

Line patterns as shown in FIGS. 10A to 10D are frequently observed in the line patterns of semiconductor devices. Applying the triangle separation function of the present embodiment therefore helps to significantly reduce the occurrence of fine drawing data, thereby improving the dimensional precision of the resist pattern and greatly reducing the drawing time.

(Embodiment 7)

The seventh embodiment of the present invention relates to an automatic CD value extraction function 18 for scanning the width of all input polygons to automatically extract the critical dimensions values based on the detected widths. This method contrasts with the CD area separating function wherein the CD values are predefined as described above.

As shown in FIG. 1, this function is provided before the CD area separating function 20 in the drawing data generating apparatus 10 of the invention, and is used in combination with the CD area separating function. Specifically, the CD values extracted by the automatic CD value extraction function 18 of the present embodiment are input to the automatic CD area separating function 20 for separating the CD areas from the polygon.

Figure 11:
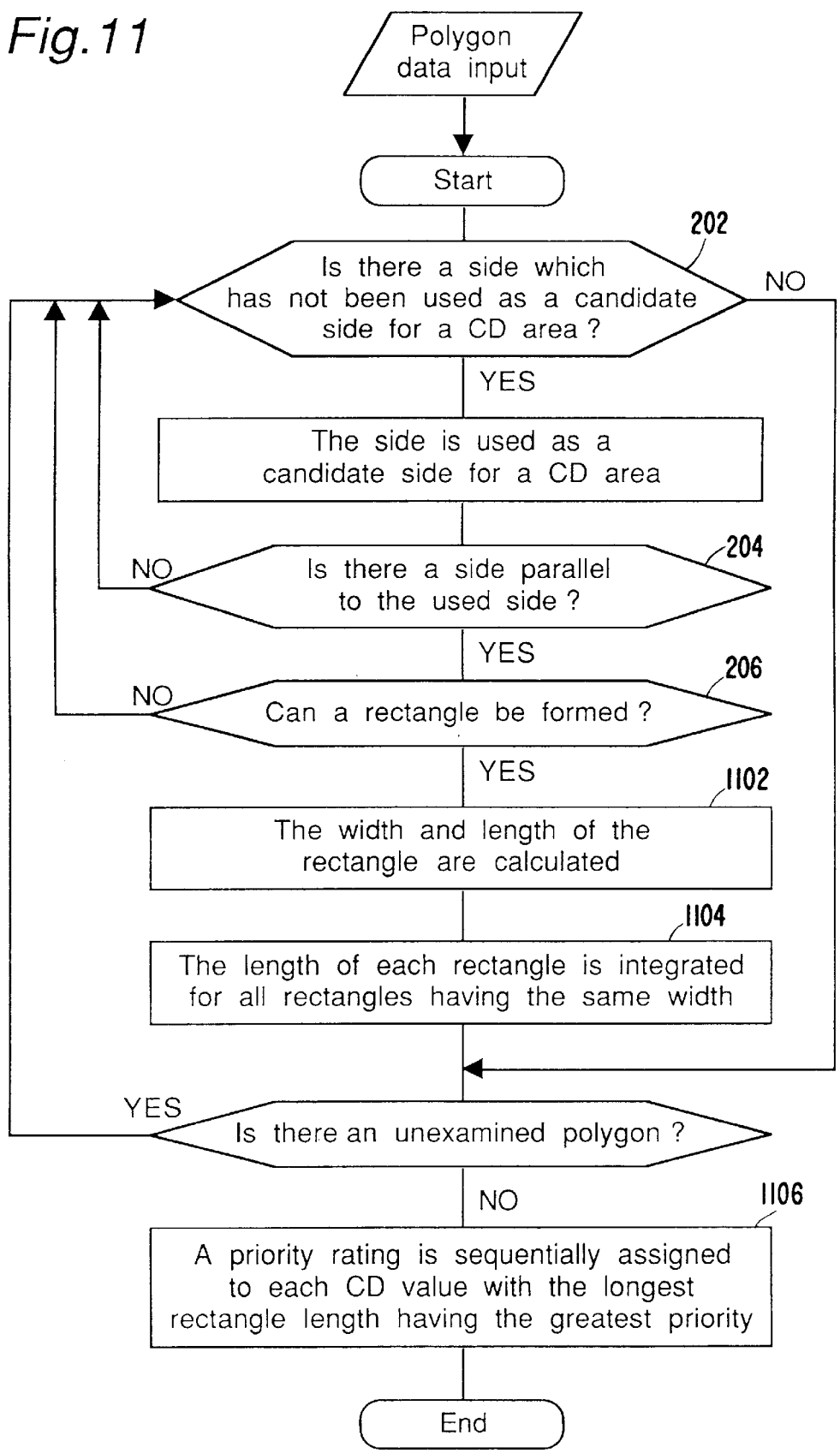
FIG. 11 is a flow chart of the automatic critical dimensions (CD) value extracting function according to a preferred embodiment of the present invention.

A flow chart of this process is shown in FIG. 11.

This automatic CD value extraction function 18 extracts from all polygons the widths of all rectangular components formed by any two sides affecting the dimensional precision of the resist pattern (1102). The length of each rectangle is calculated for all rectangles having the same width, the rectangle widths are defined as the CD values (1104), and a priority rating is sequentially assigned to each CD value with the longest rectangle length having the greatest priority (1106).

Figure 12:
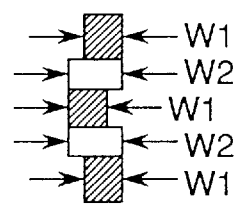
FIG. 12 is used to describe a specific application of the automatic critical dimensions (CD) value extracting function according to a preferred embodiment of the present invention.

An example is shown in FIG. 12. The shaded areas of width W1 and areas of width W2 are obtained by extracting the rectangular components of the polygon. The total length L1 of the lengths of the representative sides of the rectangles of width W1 is calculated, and the total length L2 of the lengths of the representative sides of the rectangles of width W2 is calculated. Because L1>L2 in the case shown in FIG. 12, W1 is extracted as the CD value with highest priority.

While the CD values are extracted above by scanning all polygons in the pattern, it is also possible to sample a number of polygons to extract the CD values by scanning only the sampled polygons.

In the circuit patterns of most LSI devices, the CD area length is normally significantly greater than the length of shapes having a width other than the CD value, and CD value extraction can be completed easily and accurately using the automatic CD value extraction method of the present embodiment.

(Embodiment 8)

The eighth embodiment of the invention relates to a basic geometric shape separating function 22 for dividing the polygons remaining after CD area (or value) separation into basic geometric shapes.

Figure 13:
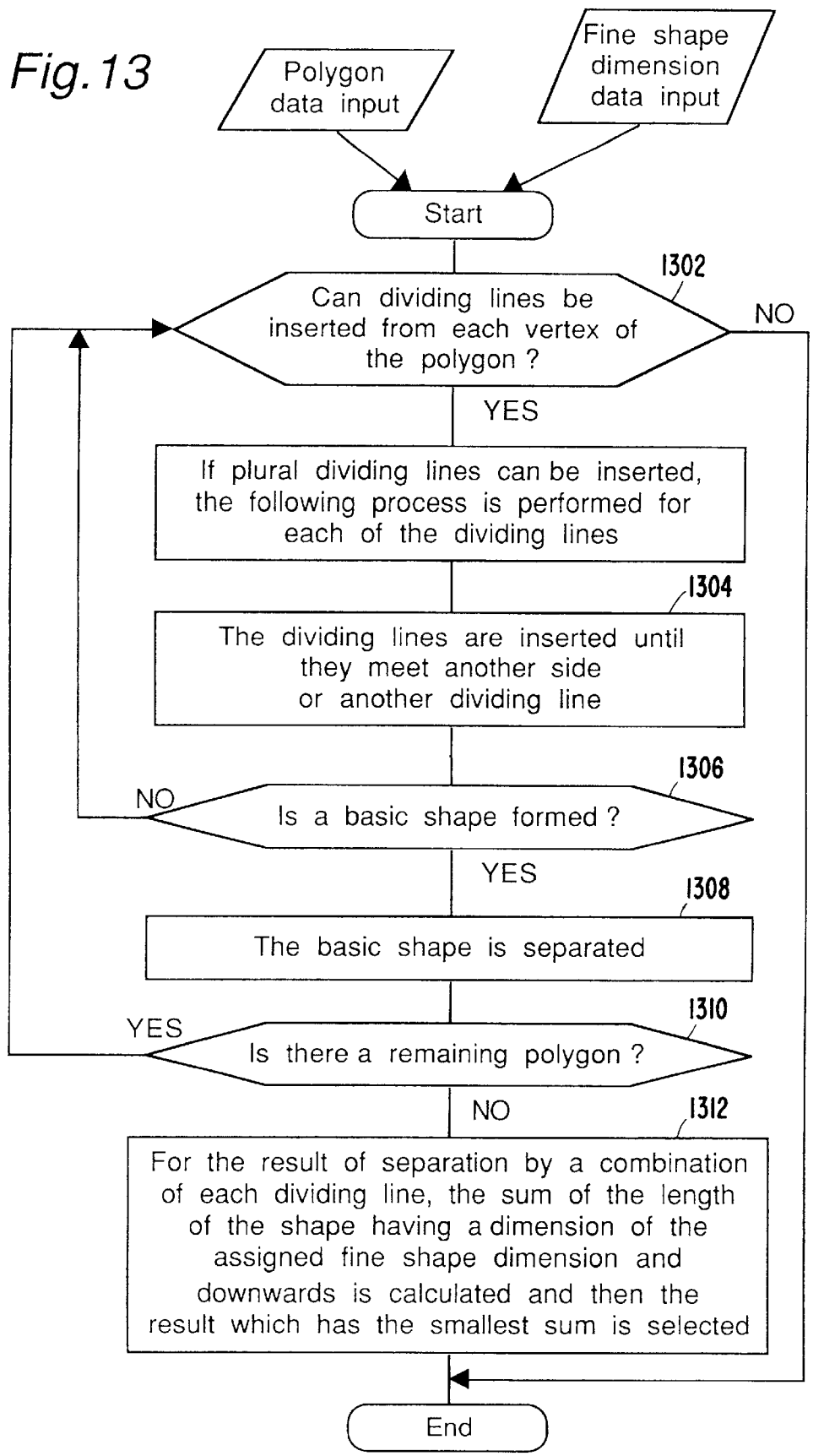

A flow chart for this process is shown in FIG. 13.

Each vertex of the input polygon is checked in sequence to determine whether a dividing line can be inserted to the polygon (1302), and the dividing lines are inserted from each vertex until the dividing line meets another side or another dividing line (1304). When a basic geometric shape is formed (1306) by dividing line insertion, that shape is separated (1308) from the polygon. If the shape remaining after basic geometric shape separation is a polygon (1310), dividing lines are again inserted and basic geometric shapes separated until no more dividing lines can be inserted to separate additional basic geometric shapes. When plural dividing lines can be inserted from a single vertex, shape separation is continued for each of the dividing lines. The result of this operation will be plural separation results of which the best separation results are selected and output.

To determine the best separation results, it is possible, for example, to select the separation results for which the length of the representative sides of the fine drawing data areas smaller than a predetermined fine drawing size is smallest (1312).

A specific example is shown in FIG. 14 and described below.

Eight separation results can be obtained as a result of inserting dividing lines from each vertex. Of these, the best separation result is separation result 3-1 whereby no fine drawing data areas are created.

High quality drawing data can therefore be generated by means of the present embodiment because the best separation results can be selected from among the plural possible separation results.

(Embodiment 9)

The ninth embodiment of the present invention relates to an alternative method for determining the best separation results in the basic geometric shape separation process described as the eighth embodiment above.

Figure 15:
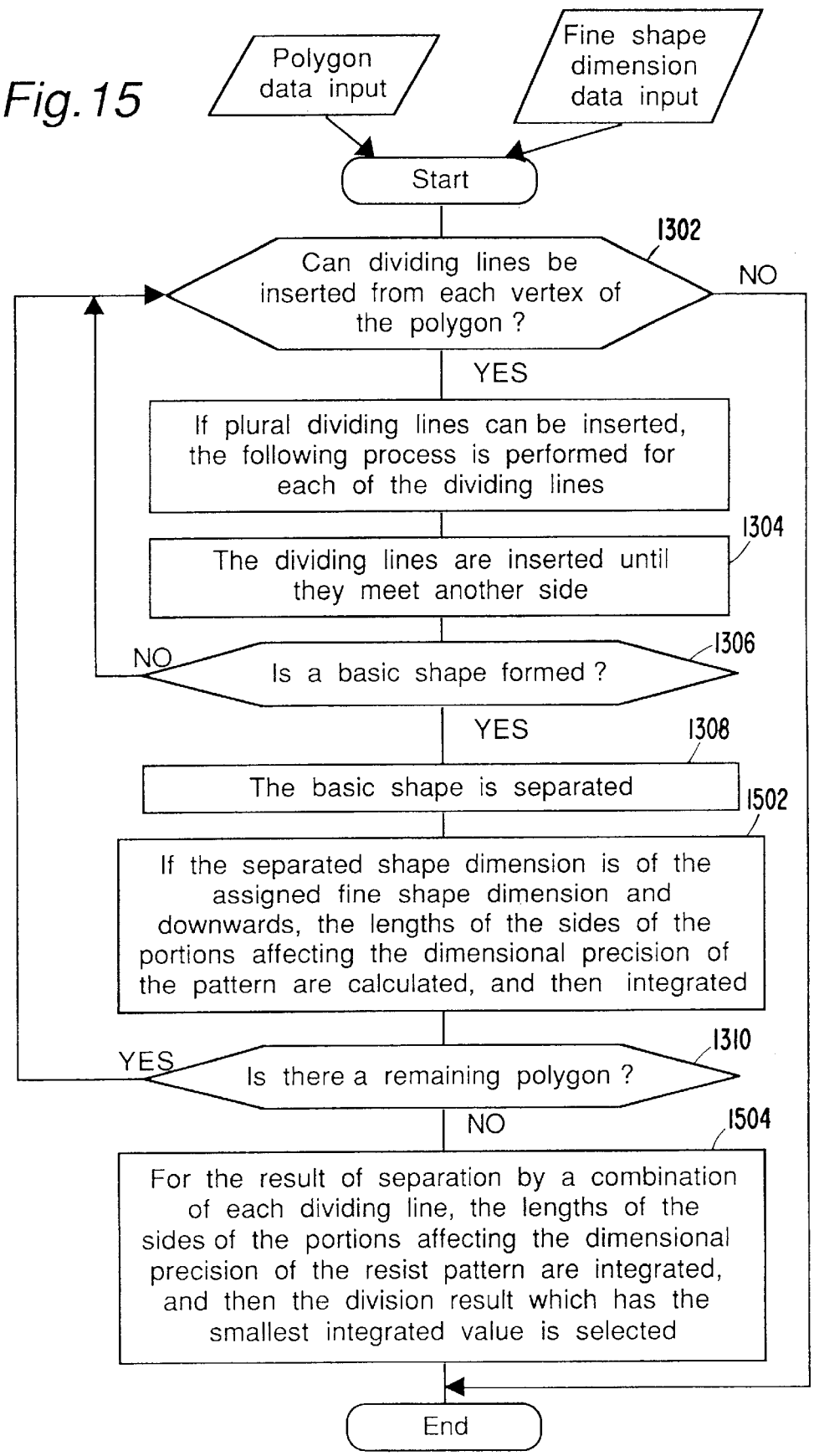

The present embodiment does not simply base the selection of the best basic geometric shape separation results on the sum of the lengths of the representative sides of shapes having a size less than a predetermined drawing size. Instead, as shown in FIG. 15, the present embodiment calculates the lengths of the sides of fine drawing data affecting the dimensional precision of the pattern to be formed (1502), and selects as the best results those for which this calculated value is smallest (1504).

It is therefore possible to more accurately select the best separation results.

(Embodiment 10)

The tenth embodiment is an alternative embodiment of the basic geometric shape separation process 22 described above.

In the basic geometric shape separation process described in the ninth embodiment above, the separation process is repeated until each polygon has been completely divided into basic geometric shapes, and the best separation result is then selected. The problem with this method is that when the polygon has a large number of vertices, a large number of separation results is obtained, and the required processing time increases. The tenth embodiment of the invention solves this problem to shorten the required processing time.

Figure 16:
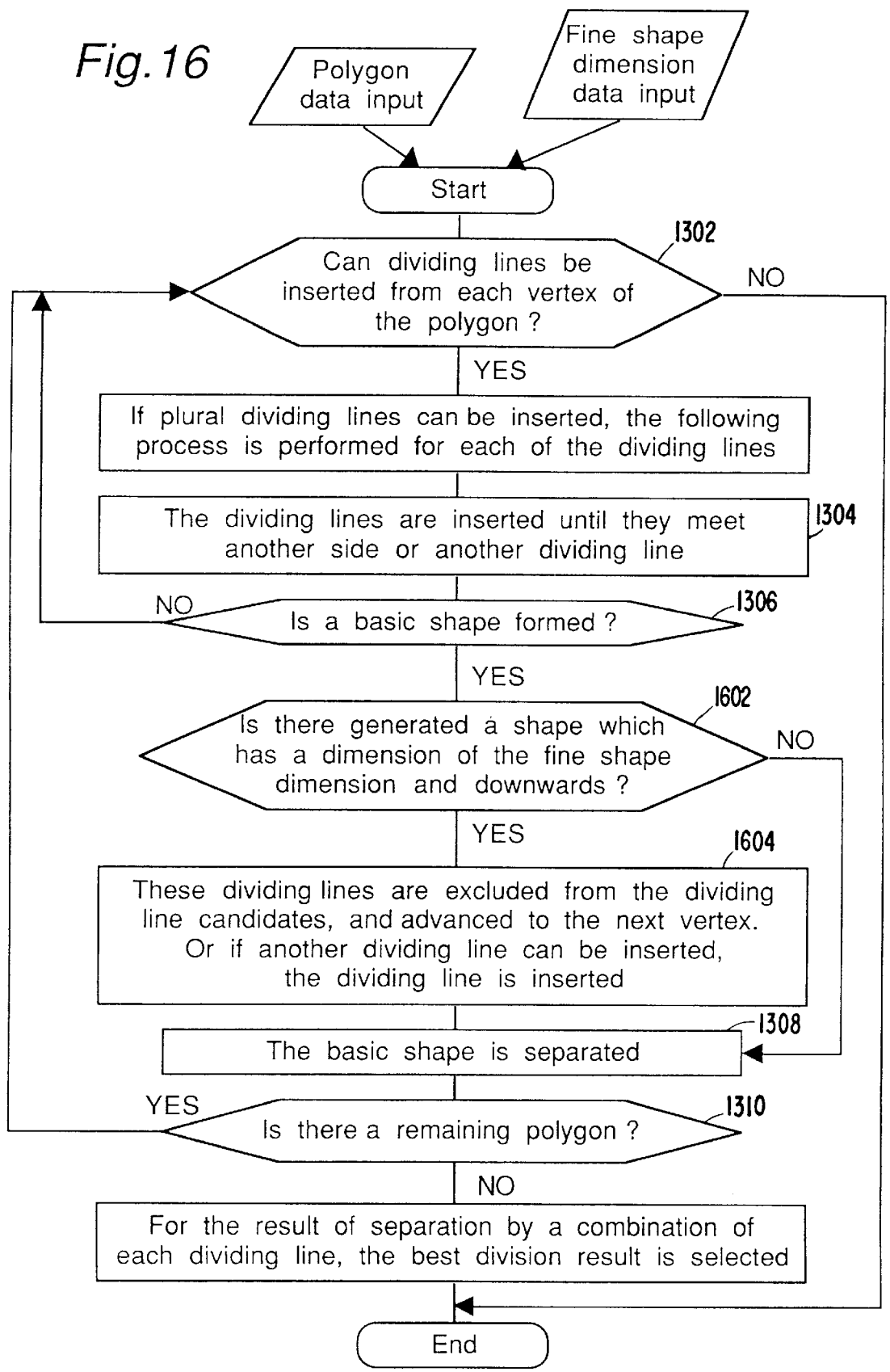

A flow chart for this process is shown in FIG. 16.

When inserting a specific dividing line will create a fine drawing data area (1602) that will contribute to degrading the dimensional precision of the pattern, the method of the present embodiment excludes that dividing line from the dividing line candidates (1604), and advances to the next vertex to continue basic geometric shape separation.

For example, referring to FIG. 14, inserting the first dividing line immediately creates a fine drawing data area as shown by separation result 1. As a result, the process skips generating all separation results that are derivative of separation result 1 (i.e., separation results 1-1 and 1-2).

By thus eliminating the execution of meaningless separations, the method of the present embodiment can shorten the overall processing time required.

(Embodiment 11)

Figure 17B:
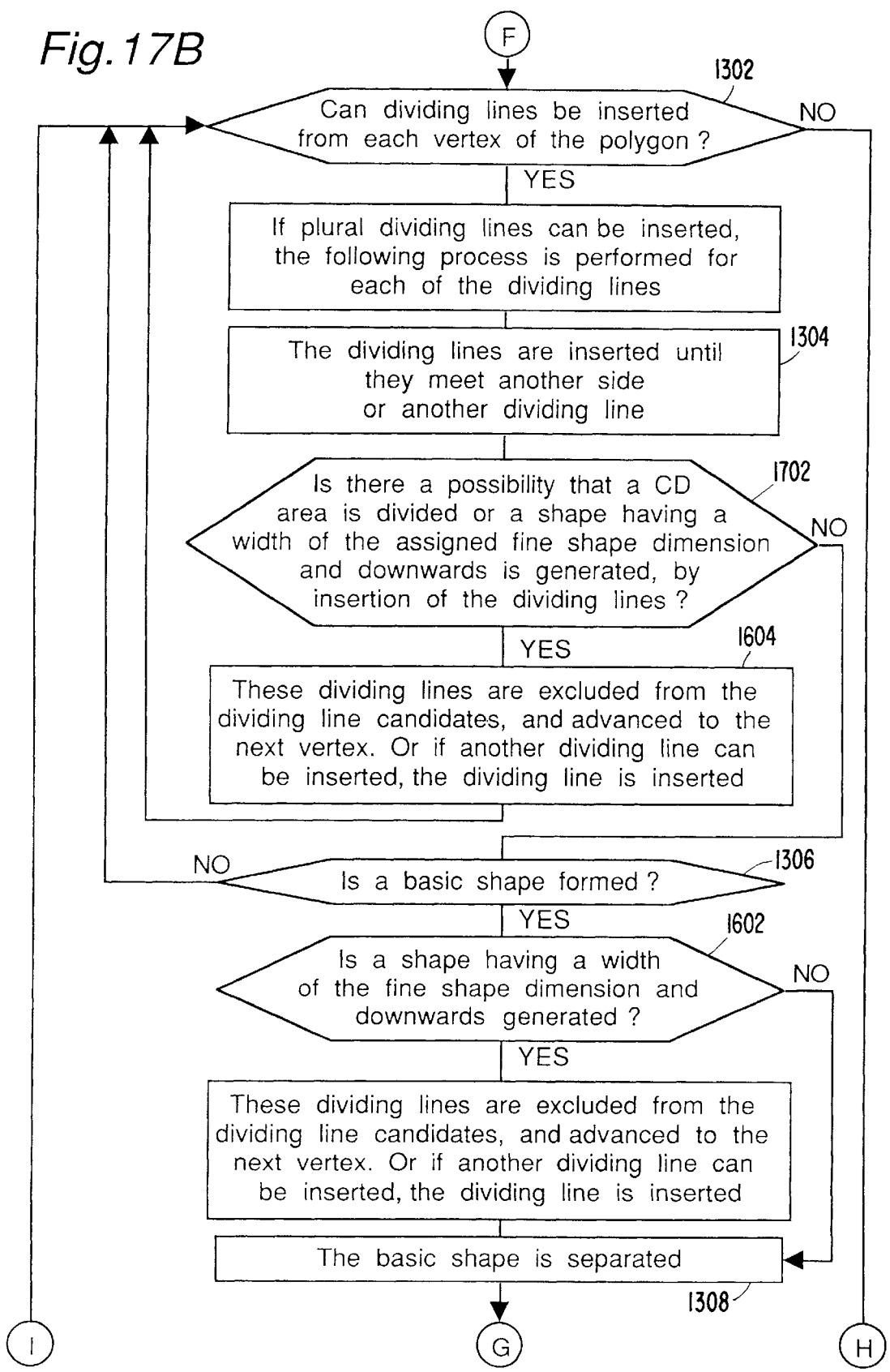
Figure 17C:
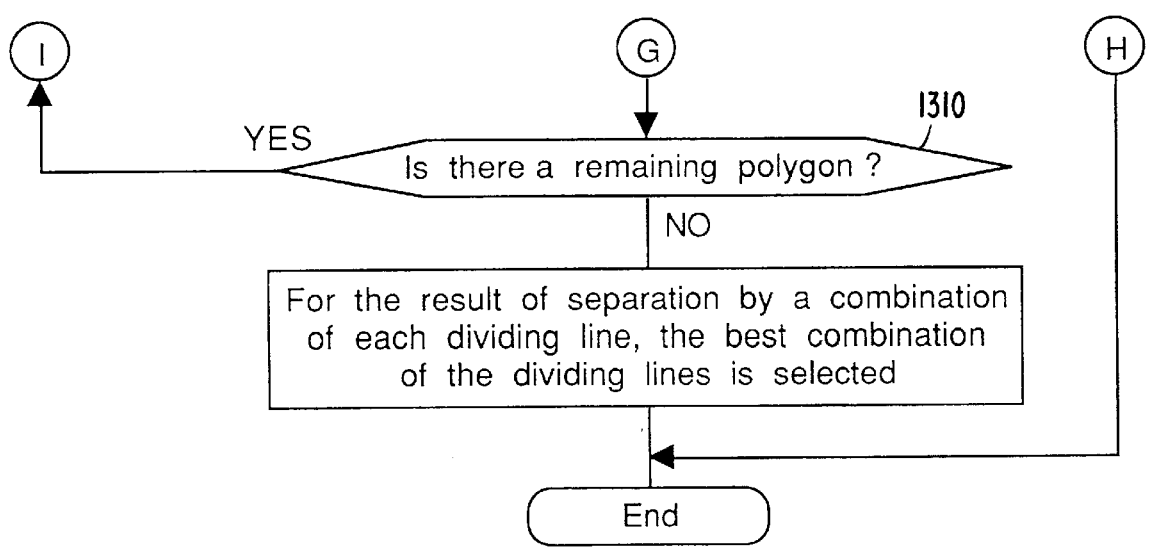

The eleventh embodiment is an alternative embodiment of the basic geometric shape separation process 22 described above as the tenth embodiment. This eleventh embodiment further shortens the required processing time while enabling high precision basic geometric shape separation processing, as shown in FIGS. 17A to 17C.

In the method of the tenth embodiment above, any dividing line which when inserted creates a fine drawing data area that will contribute to degrading the dimensional precision of the pattern is excluded from the dividing line candidates separating the basic geometric shapes, and the process then advances to the next vertex to continue basic geometric shape separation. The method of this eleventh embodiment complements this method by similarly checking for the creation of fine drawing data areas resulting from dividing line insertion, and also determining whether inserting a dividing line will divide a CD area (1702). Any dividing line which when inserted will create a fine drawing data area or will divide a CD area is then excluded from the dividing line candidates separating the basic geometric shapes.

This check for CD area division is accomplished by obtaining the distance between the dividing line and any polygon side parallel thereto. Specifically, when the distance between the dividing line and any polygon side parallel thereto is less than the predetermined fine drawing data area dimension, there is a high probability of fine drawing data being created. When the sum of the distance between the dividing line and two parallel sides on opposing sides of the dividing line is equal to the CD value, there is a high probability that inserting that dividing line will divide a CD area. In both cases the dividing lines in question are excluded as dividing line candidates.

The basic geometric shape separation process can therefore be executed accurately and at high speed by the present embodiment.

(Embodiment 12)

The twelfth embodiment relates to a fine drawing data editing process 26 used when fine drawing data that cannot be processed by the basic geometric shape separation process is created.

Figure 18:
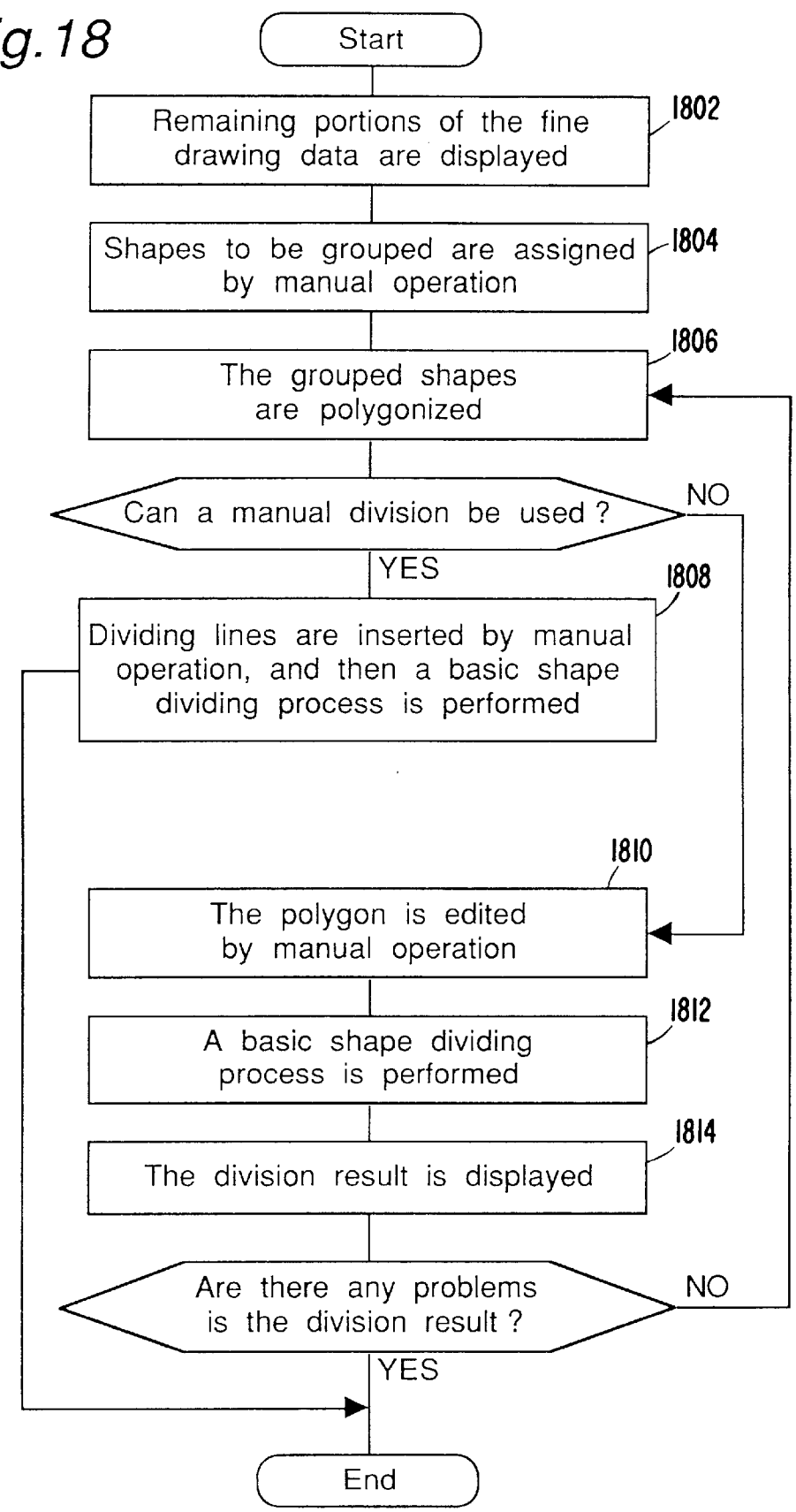
FIG. 18 is a flow chart of the fine drawing data editing function according to a preferred embodiment of the present invention.

A flow chart for this process is shown in FIG. 18.

The fine drawing data editing process 26 of this embodiment scans the basic geometric shape data after the shape merging process shown in FIG. 1 to find any fine drawing data affecting the dimensional precision of the resist pattern. When such fine drawing data is found, that fine drawing data and the surrounding shapes are displayed on a graphic display terminal (1802).

Manual intervention is then required to specify the shape (s) to be grouped (1804) with the fine drawing data to form a single polygon from the grouped shapes (1806). Dividing lines are then manually inserted to this polygon to separate the new polygon into basic geometric shapes. If inserting dividing lines still cannot resolve the fine drawing data problem, the polygon itself may be manually edited (1810). After editing the polygon, dividing lines are manually inserted or the polygon is divided (1812) using the basic geometric shape separation process described above, and processing is completed when no further problems are detected in the separation results (1814).

A general purpose pattern layout apparatus used for semiconductor device design can achieve the above method by comprising a function for creating polygons from the grouped images, a function for dividing polygons by manually inputting dividing lines, and a function automatically separating the polygons into basic geometric shapes by the basic geometric shape separation process described above.

Note that the fine drawing data editing process 26 described above can be separated from the drawing data generating apparatus of the present invention and used independently.

It is thereby possible to avoid creating fine drawing data that cannot be processed by the automatic basic geometric shape separation process, and it is thereby possible to generate high quality drawing data, by means of the fine drawing data editing process 26 of the present embodiment.

(Embodiment 13)

The thirteenth embodiment of the invention relates to an automatic chamfer member editing function 14 for suppressing, by deleting or revising unnecessary chamfered members in the input polygon data, the generation of fine drawing data causing reduced dimensional precision of the resist pattern.

As shown in FIG. 1, this function is provided within the complete drawing data generating apparatus 10 as a process preceding the triangle separation process 16.

It is to be noted that this automatic chamfer member editing function 14 of the invention is not dependent upon the overall structure of the drawing data generating apparatus 10 of the invention, and can be added as an adjunct pre-processing function to a drawing data generating apparatus according to the prior art.

Figure 19A:
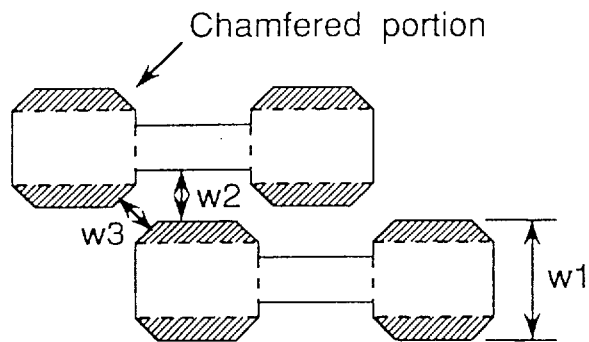
FIGS. 19A–19C, 21A–21B and 24A–24C are used to describe a specific application of the automatic chamfer member editing function according to preferred embodiments of the present invention.
Figure 19B:
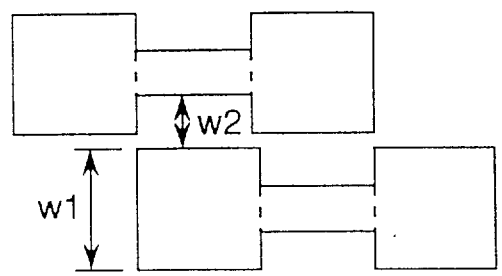
Figure 19C:
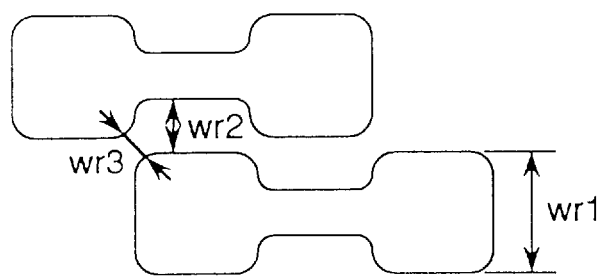

A specific example of a layout pattern whereby fine drawing data contributing to degraded dimensional precision in the resist pattern is created as a result of the chamfer members is shown in FIGS. 19A to 19C together with the edited results.

One part of the designed circuit layout is shown in FIG. 19A. When there are chamfered elements in the circuit layout as indicated by the arrow in FIG. 19A, fine drawing data as indicated by the shading occurs, and the precision of pattern width W1 and the distance W2 between patterns deteriorates.

Because the width of the fine drawing data decreases as the size of the chamfer decreases, deterioration of dimensional precision increases. With respect to the chamfer areas only, however, the practical effect on the shape of the resulting resist pattern decreases.

This is because the pattern corners generally have a certain roundness. This roundness results from the power distribution of the electron beam being an imperfect non-square distribution, and the developing speed of the resist development process being faster in corner areas. Specifically, even when the circuit layout is designed square without chamfered corners as shown in FIG. 19B, the shape of the resist pattern formed using a mask produced from this square circuit layout data will have rounded corners as shown in FIG. 19C, resulting in no difference to the pattern formed from the chamfered data shown in FIG. 19A.

The obvious solution to this problem may be to simply design the circuit layout from the beginning without using chamfered corners. The problem is that an audit known as a design rule check is generally applied before the drawing data is generated from the circuit layout data, and problems arise because part of this design rule check is to determine whether all circuit layout data conforms to the specified minimum pattern dimensions and minimum gap dimensions between pattern components.

For example, the gap W3 between the chamfered pattern element corners shown in FIG. 19A does not violate the design specifications. When the circuit layout does not use chamfers as shown in FIG. 19B, however, the minimum gap dimension between corner elements will often violate the design specifications. It is therefore not possible to completely eliminate the use of such chamfer members.

The present embodiment therefore automatically modifies any chamfer elements not violating the design specifications to minimize the creation of fine drawing data and improve the dimensional precision of the resist pattern.

A flow chart for this process is shown in FIG. 20.

In the preferred method of the present embodiment the maximum length Lmax of a chamfer member side not violating the design specifications is obtained experimentally and input to the process (2002).

Any sides of the input polygon shorter than this Lmax length are then detected (2004), and if the angle formed by the two sides to which this short side is connected is ninety (90) degrees (2006), the detected short side (2008) is edited as a chamfer side.

The chamfer sides can be edited by defining a new vertex at the virtual intersection of the two sides to which the sloped chamfer side is connected, and then deleting the two vertices at the ends of the chamfer line.

It is thereby possible to suppress the creation of fine drawing data areas caused by non-critical chamfer lines, and to thereby improve the dimensional precision of the resist pattern.

(Embodiment 14)

The fourteenth embodiment of the invention relates to a fine drawing data editing process for suppressing the generation of fine drawing data by revising small sides that can be handled in the same manner as the chamfered sides processed by the automatic chamfer member editing function of the thirteenth embodiment but which do not satisfy the chamfer side test condition of the automatic chamfer member editing function, i.e., the angle formed by the two sides to which this small side is connected is not ninety (90) degrees.

An example of this process is described with reference to FIGS. 21A and 21B below.

Figure 21A:
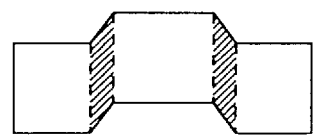

FIG. 21A shows an example wherein the angle formed by the two sides connected to the small side are parallel to each other and therefore do not form a ninety (90) degree angle. When a polygon such as this is divided into the basic geometric shapes, fine drawing data is generated as shown by the shaded areas. When substantially all of the fine drawing data shape is inside the polygon as occurs in this example, the fine drawing data has a minimal effect on the dimensional precision of the resist pattern. The creation of numerous fine drawing data areas that are substantially meaningless, however, increases the total drawing time required.

The object of the present embodiment is therefore to suppress the creation of fine drawing data areas that are noncritical to resist pattern formation, and to shorten the required drawing time by reducing the number of fine drawing data areas.

Figure 22:
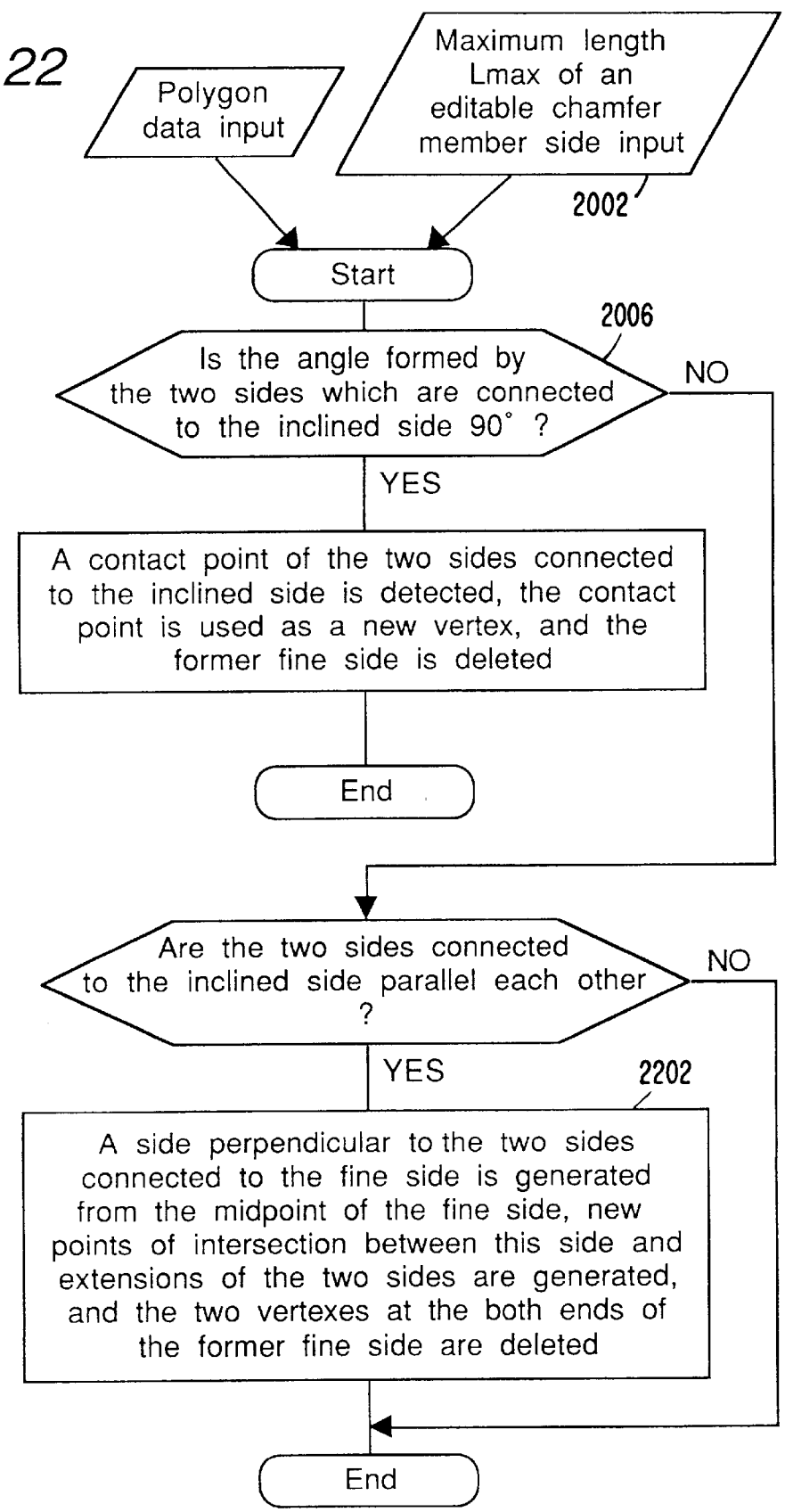

A flow chart for this method is shown in FIG. 22. In this method, a side perpendicular to the two sides connected to the small side is generated from the midpoint of the small side, new points of intersection between this newly generated side and extensions of the two sides connected to the small side are generated, and the two original vertices at the ends of the small side are then deleted (2202).

Figure 21B:
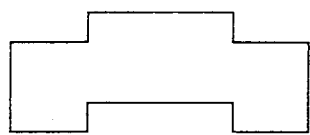

The result of separating the basic geometric shapes from the polygon after this small side editing process is shown in FIG. 21B. Note that there are no fine drawing data areas, and that the number of shapes has been reduced, with the polygon shown in FIG. 21B.

As will also be understood from FIGS. 21A and 21B, the present embodiment improves the dimensional precision of the resist pattern only in the area of the small inclined sides, and therefore contributes to a smaller improvement in the dimensional precision of the resist pattern than does the method of the thirteenth embodiment above. However, the method of this fourteenth embodiment substantially reduces the number of basic geometric shapes containing fine drawing data areas with an inclined side requiring a longer drawing time, and thereby has the effect of substantially reducing the required drawing time.

(Embodiment 15)

The small side editing method of the fourteenth embodiment above creates a new side intersecting with extensions of the two sides connected to the small side from the midpoint of the small side, and is effective when the slope of the small side is forty-five (45) degrees. When the slope of the small side is not forty-five (45) degrees, however, the drawn resist pattern will be closer to the pattern formed using the unedited drawing data if the drawing data is generated by creating a new side bisecting the area of the triangular unit formed by the small side rather than from the midpoint of the small side.

Figure 23:
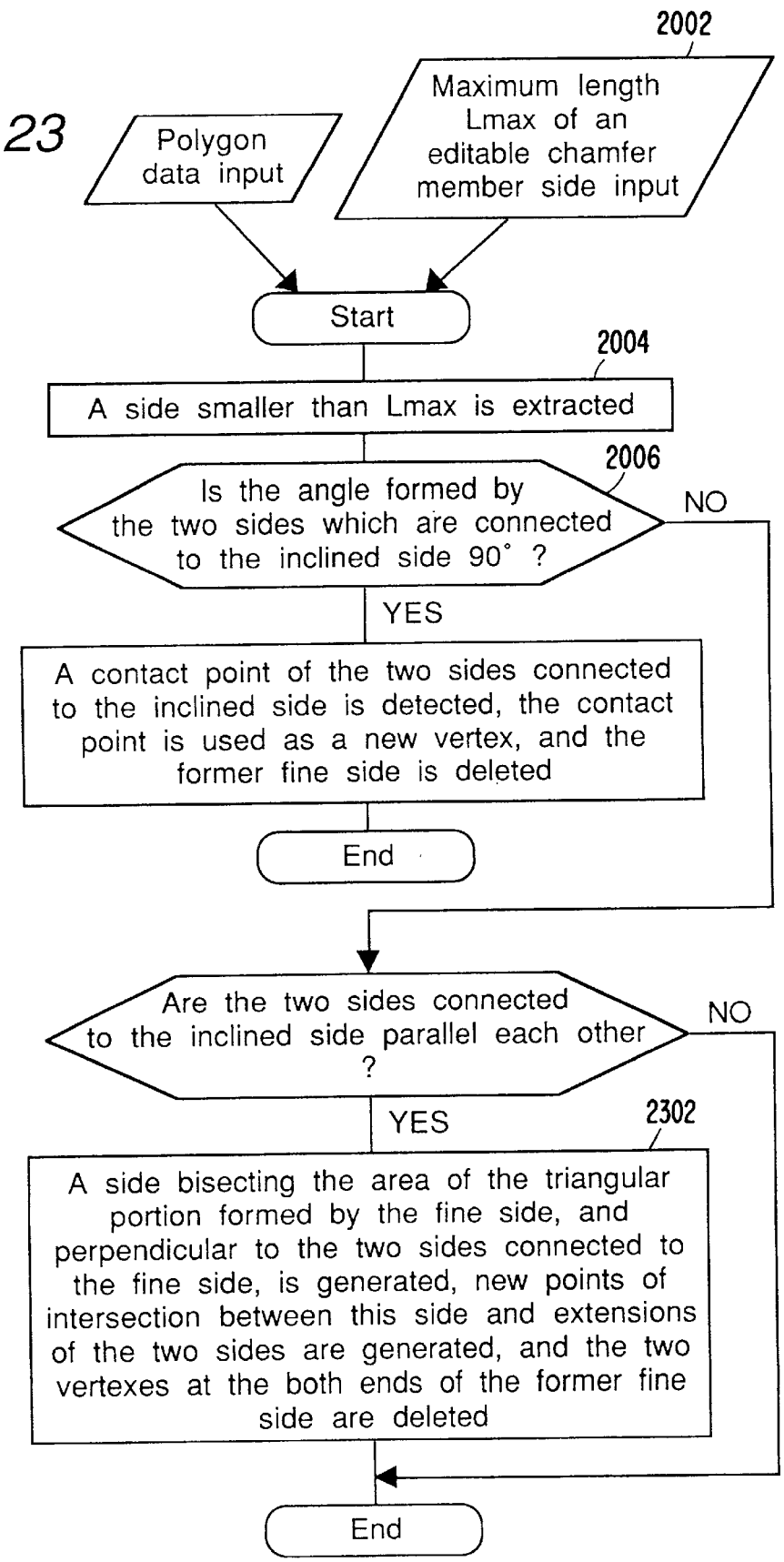
Figure 24A:
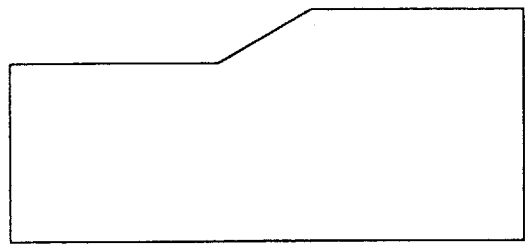
Figure 24B:
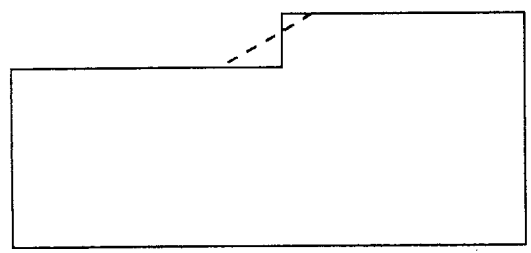
Figure 24C:
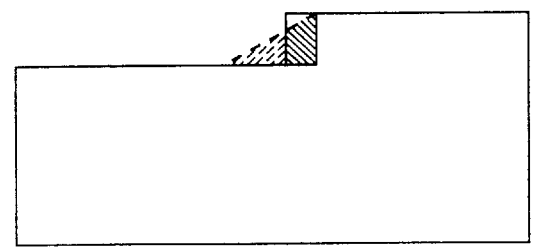

A flow chart of this method is shown in FIG. 23, and a specific example is shown in FIGS. 24A to 24C.

As will be known from FIG. 24C, the new side is generated to obtain an equal area in the area shaded with dots and the area shaded with slashes.

By using the drawing data generated by editing the small sides according to the method of this embodiment, it is possible to form patterns that are more faithful to the pattern that would be formed using the drawing data generated from the unedited layout data (2302).

(Embodiment 16)

While the fifteenth embodiment of the invention generates a new side bisecting the area of the triangular unit formed by the small side, and thereby enables drawing a pattern more faithful to the original layout pattern than is achieved by the editing method of the fourteenth embodiment, it is possible by this sixteenth embodiment to draw a pattern that is even closer to the pattern that would be formed using the drawing data generated from the unedited layout data. Specifically, the method of the sixteenth embodiment determines experimentally or by simulation where the new side should be generated using as parameters the length of the small side, the angles formed by the small side and the sides connected thereto, and on which side of the small side the drawing data area is located (i.e., inside or outside the polygon) (2502). This data is stored in data tables, which are then referenced during the drawing data generating process to edit the small sides.

A flow chart of this process is shown in FIG. 25.

By using the drawing data generated after editing the small sides according to the method of the present embodiment, it is possible to form patterns that are more faithful to the pattern that would be formed using the drawing data generated from the unedited layout data.

(Embodiment 17)

The method of the seventeenth embodiment of the invention relates to a drawing data generating method controlling the executing sequence of the automatic chamfer member editing process and the triangle separation process is controlled to first edit the chamfer lines, and then separate the triangular shapes.

When the triangle separation process is executed before the automatic chamfer member editing process, the triangular shapes containing the chamfer sides will be separated by the triangle separation process before they can be edited by the chamfer member editing process, and uneditable fine drawing data areas will be created. An example of this is shown in FIGS. 26A to 26C.

Figure 26A:
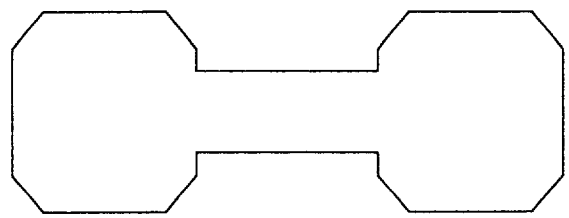
FIGS. 26A–26C is used to describe a specific application of the triangle separation function according to a preferred embodiment of the present invention.
Figure 26B:
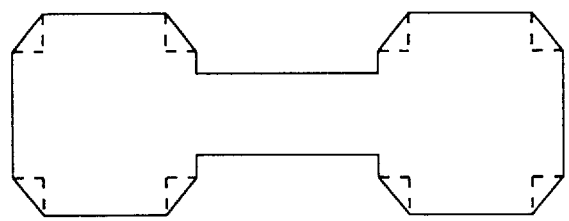
Figure 26C:
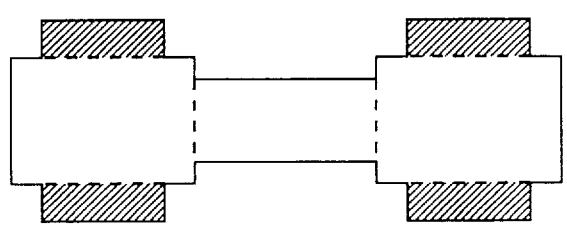

When the triangles are first extracted from the polygon as shown in FIG. 26A, the triangles containing the chamfer sides will be excised from the image as shown in FIG. 26B, and uneditable fine drawing data areas will be created as shown in FIG. 26C.

By first editing the chamfer members by means of the present embodiment, however, the creation of uneditable fine drawing data areas can be avoided, and higher quality drawing data can thereby be created.

(Embodiment 18)

The method of the eighteenth embodiment is an alternative triangle separation process 16 whereby triangles containing a chamfer line are not excised by the triangle separation process. This is achieved by evaluating slightly sloping sides to determine whether such sides are chamfer lines.

A flow chart of this process is shown in FIG. 27.

High quality drawing data can be created by means of this embodiment because uneditable fine drawing data areas are not created even when the triangle separation process is executed before editing chamfer lines.

(Embodiment 19)

The method of the nineteenth embodiment is an alternative method for the basic geometric shape separation function 22 dividing polygons into basic geometric shapes.

Figure 28:
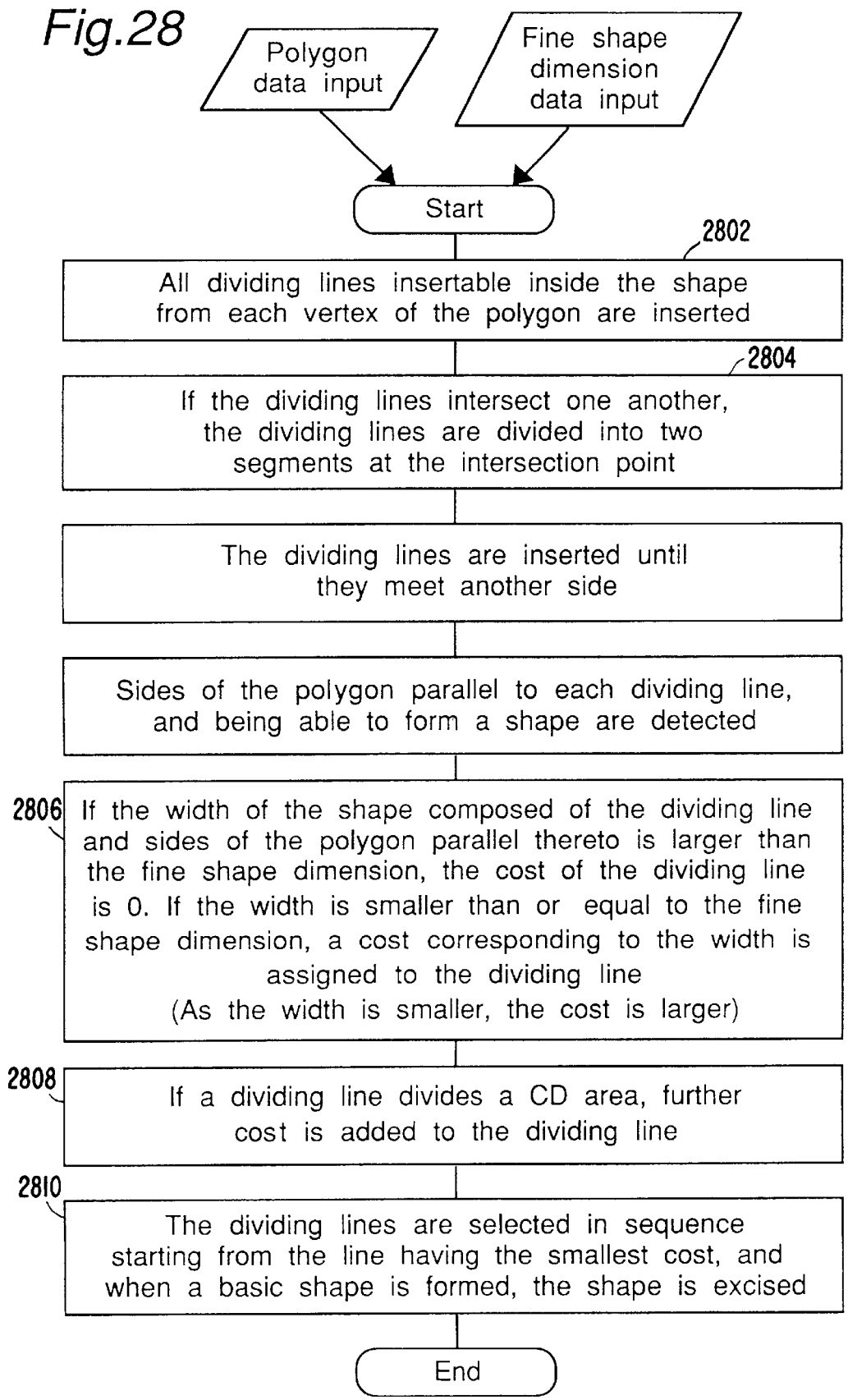
FIG. 28 is a flow chart of the basic geometric shape separation function according to a preferred embodiment of the present invention.
Figure 29A:
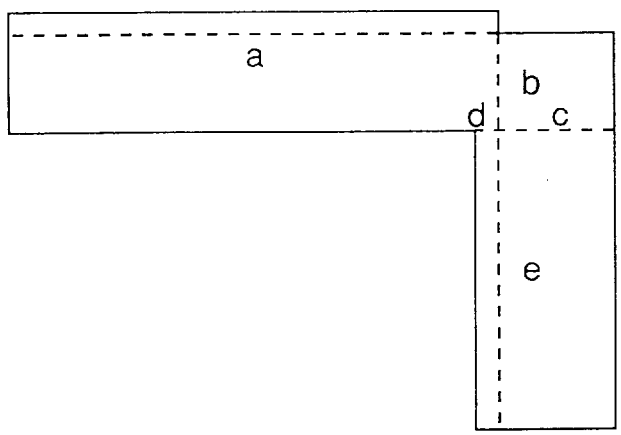
FIGS. 29A–29B are used to describe a specific application of the basic geometric shape separation function according to a preferred embodiment of the present invention.
Figure 29B:
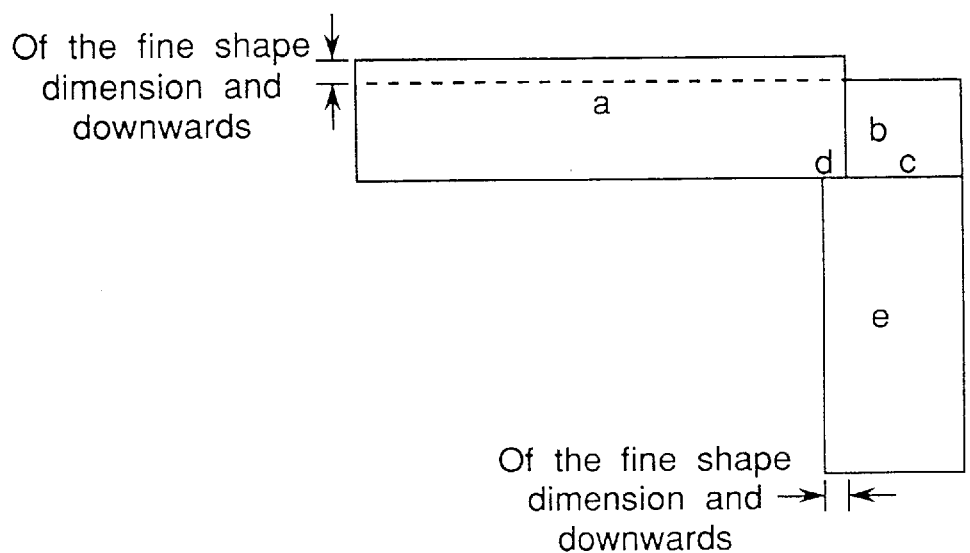
Figure 30A:
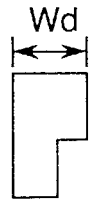
FIGS. 30A–30D are used to describe the generation of drawing data from the circuit layout design data, and the method of circuit layout drawing.
Figure 30B:
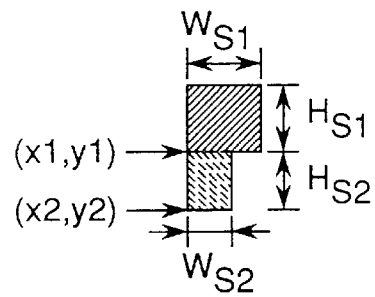
Figure 30C:
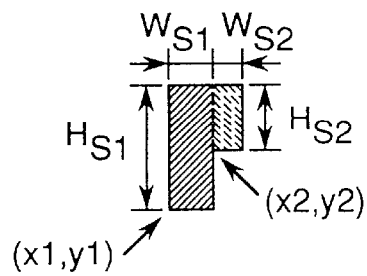
Figure 30D:
Figure 31A:
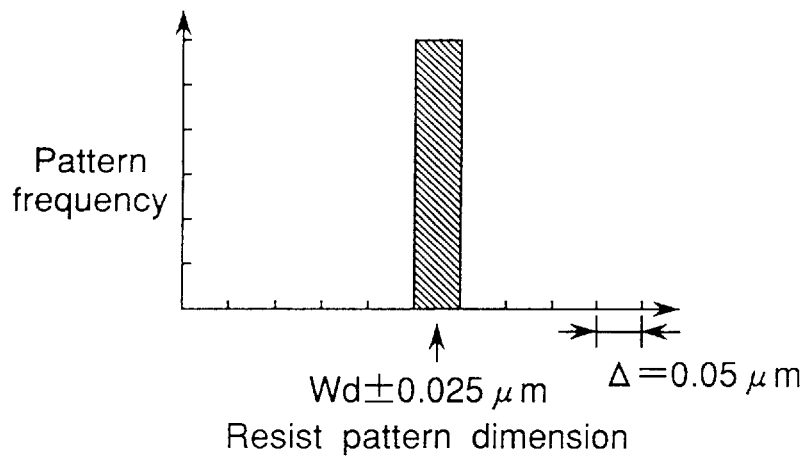
FIGS. 31A–31B show the change in the dimensional precision of the resist pattern depending upon the method of generating the drawing data.
Figure 31B:
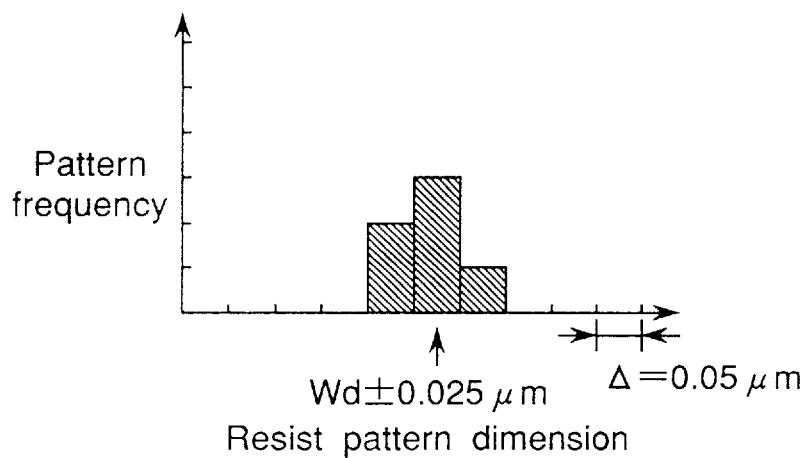
Figure 34:
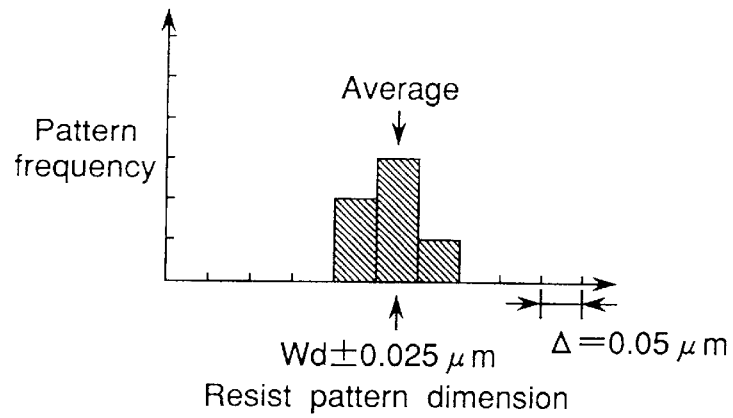
FIG. 34 is a graph of the deterioration in the dimensional precision of the resist pattern when fine drawing data areas are contained in the circuit layout.
Figure 35:
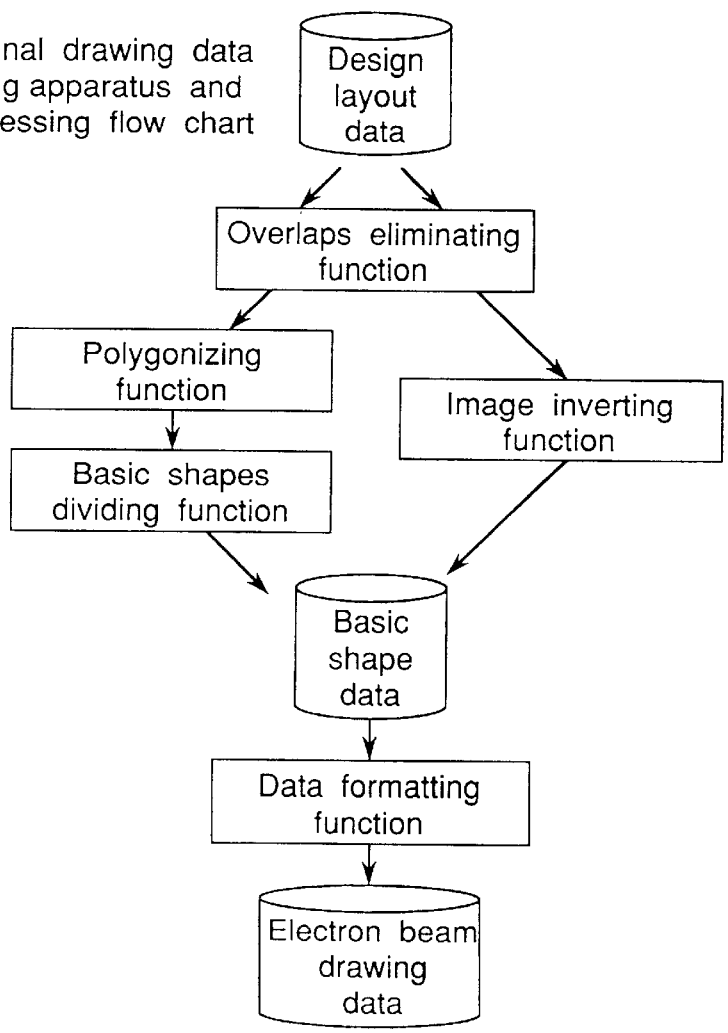
FIG. 35 is a flow chart of the data processing operation and functions of the drawing data generating apparatus in a conventional variable output electron beam drawing apparatus.
Figure 36A:
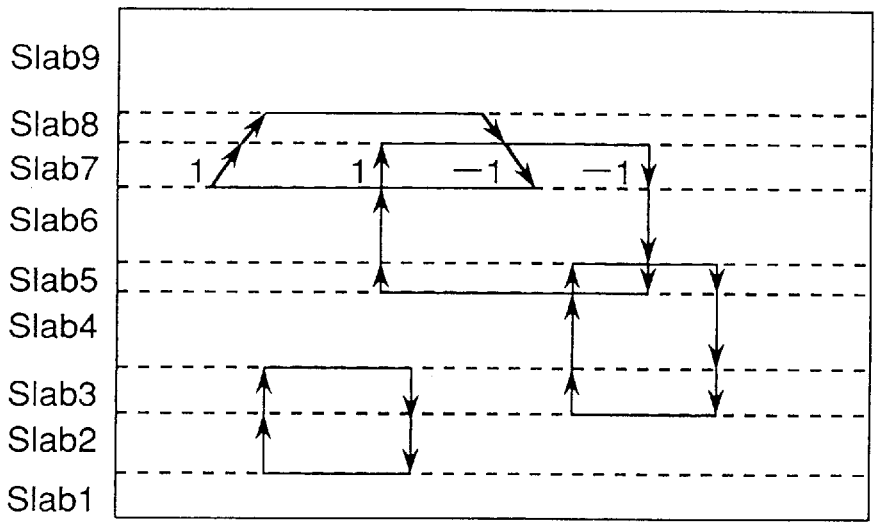
FIGS. 36A–36B are used to describe the conventional means of removing overlapping areas in the circuit layout.
Figure 36B:
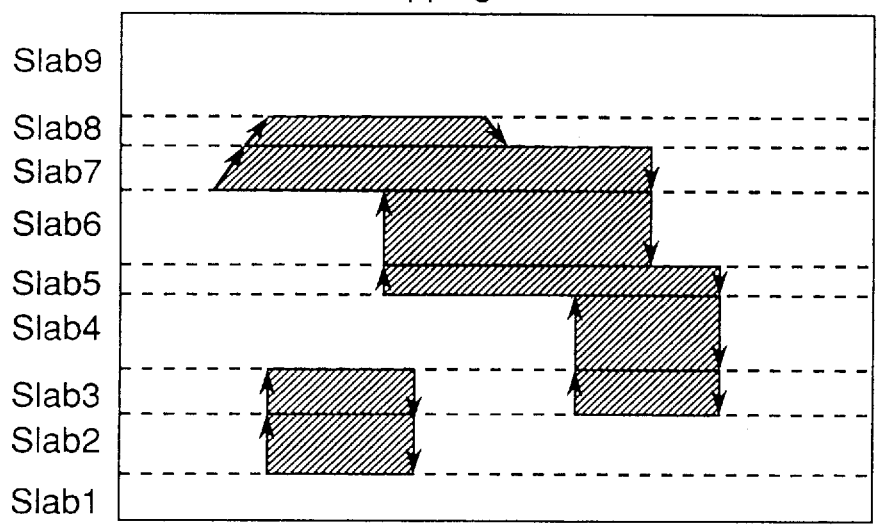
Figure 37A:
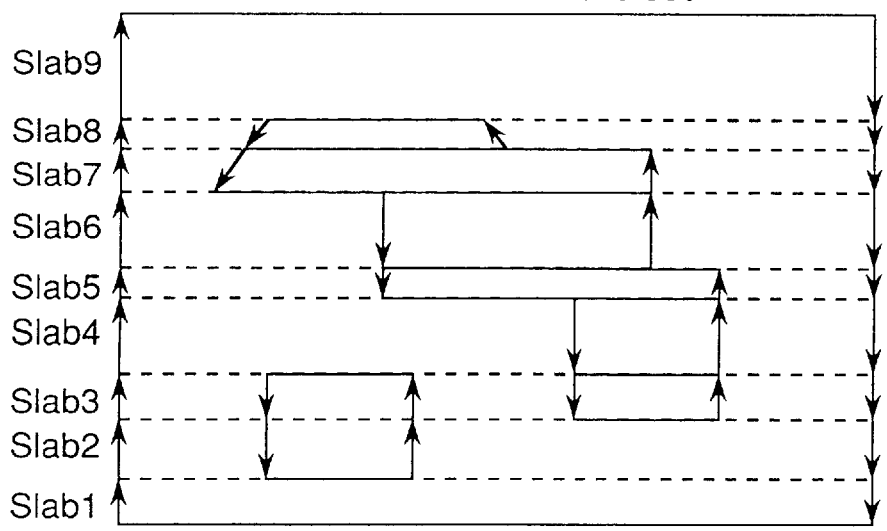
FIGS. 37A–37B are used to describe the conventional means of image (black/white) inversion.
Figure 37B:
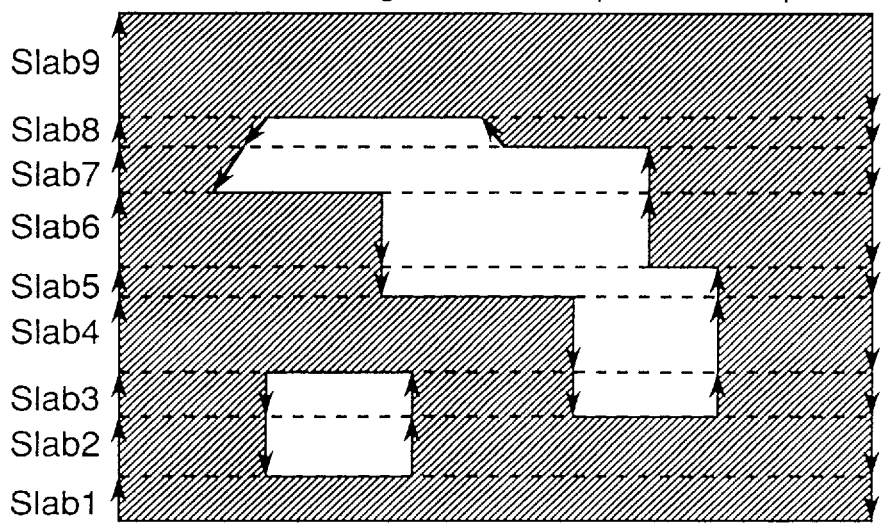
Figure 38:
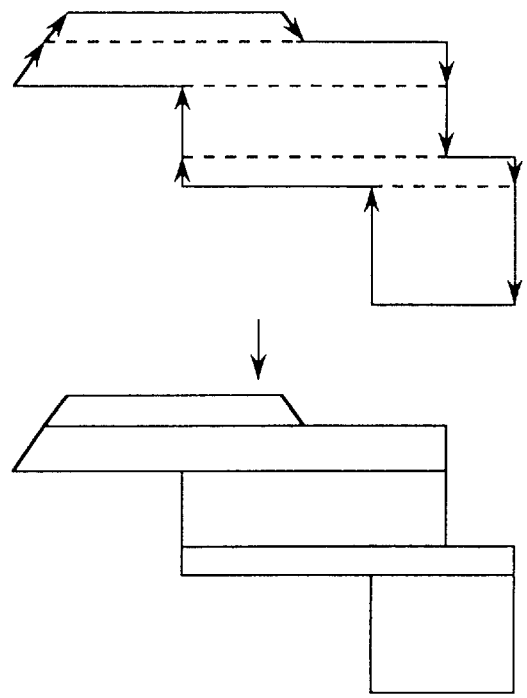
FIG. 38 is used to describe the conventional basic geometric shape separation process.
Figure 39:
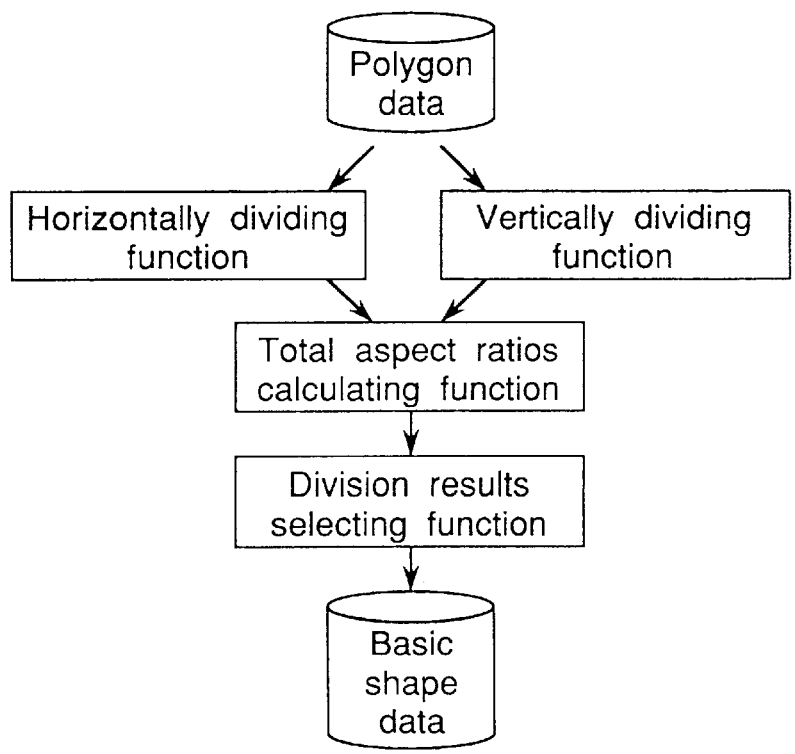
FIG. 39 is a flow chart of an improved basic geometric shape separation process according to the prior art.

A flow chart of this method is shown in FIG. 28, and a specific example is shown in FIGS. 29A and 29B.

By this method, all insertable dividing lines are first inserted inside the polygon from each vertex of the polygon (2802). When inserted dividing lines intersect, the intersecting dividing lines are divided into two line segments at the point of intersection (2804). In the example shown in FIG. 29A, five dividing lines "a" through "e" are inserted.

Sides of the polygon parallel to the inserted dividing lines are then detected, and the distance between the dividing line and the detected parallel side is determined. If this distance is less than or equal to the predetermined fine drawing data dimension, a constant positive value (the "cost") is assigned to that dividing line (2806).

This cost is related to the deterioration of pattern precision associated with the line, i.e., the smaller the distance (the width of the area formed by the dividing line and the parallel side), the greater the deterioration of pattern precision. The assigned cost value is therefore set high. If this distance (the width of the area formed by the dividing line and the parallel side) is greater than the fine drawing data dimension, the assigned cost is zero (0).

It is then determined whether any dividing line divides a critical dimensions area. A similar cost is assigned to any dividing line dividing a critical dimensions area (2508).

The sum of the cost and dividing line length is then obtained for each dividing line, and the dividing lines are selected in sequence starting from the lines having the smallest sum. When a basic geometric shape is formed by the selected dividing line and polygon sides, that shape is excised (2810).

Referring to FIGS. 29A and 29B, dividing lines "a" and "e" create fine drawing data areas, and therefore have a high cost. Dividing lines "b", "c", and "d" are therefore selected first, and as a result no fine drawing data areas are created.

The overall drawing data generating process can be executed more quickly using the method of the present embodiment than is possible using the method described as the ninth embodiment above. This is because the method of the ninth embodiment selects the best results after considering all possible dividing line combinations, while the method of the present embodiment sequentially selects the dividing lines starting from the dividing lines not resulting in fine drawing data areas. Unnecessary data processing is thereby avoided, and the operation can be executed more quickly.

As will be obvious from the above descriptions of the preferred embodiments of the present invention, it is possible to manufacture high design precision semiconductor devices using the high precision drawing data generated by the automatic critical dimensions (CD) area separating process of the invention for pre-separating the critical dimensions areas requiring high dimensional precision.

It is also possible to manufacture high design precision semiconductor devices by using as the automatic critical dimensions (CD) area separating process of the invention: a drawing data generating method for detecting the internal sides of each polygon, and not using these internal sides as candidate sides forming the critical dimensions area; a drawing data generating method for interrupting the critical dimensions area separation process when fine drawing data is generated as a result of critical dimensions area separation in the automatic critical dimensions (CD) area separating process; a drawing data generating method for defining plural critical dimensions values, and alternatively assigning a priority value to each of the plural critical dimensions values; a drawing data generating method for executing both a process for scanning the polygon widths to automatically extract the critical dimensions, and a process for inputting the extracted critical dimensions to the automatic critical dimensions (CD) area separating function.

High precision drawing data can be generated in a short period of time, and high design precision semiconductor devices can be supplied at low cost by using a triangle separation process according to the present invention for pre-separating the right triangle components from the polygons before the critical dimensions (CD) area separating process.

High design precision semiconductor devices can also be supplied at low cost by using as the triangle separation process a method whereby triangles having a slightly sloping side are not separated during the triangle separation process.

High design precision semiconductor devices can also be manufactured by generating high quality drawing data by executing a basic geometric shape separation process according to the present invention for selecting the best separation results based on a predetermined evaluation standard from among the plural separation results formed by sequentially inserting dividing lines from each vertex of the polygon.

It is also possible to manufacture high design precision semiconductor devices by using as the basic geometric shape separation process for selecting the best separation results: a method for selecting the separation results of which the sum of the lengths of the representative sides of the fine drawing data affecting the dimensional precision of the pattern is smallest; a method for calculating for the separation results the lengths of the representative sides of the fine drawing data affecting the dimensional precision of the resist pattern for each combination of dividing lines during dividing line insertion, and selecting the separation results for which the calculated value is smallest; a method for not inserting a dividing line when such dividing line insertion will create fine drawing data; a method for not inserting a dividing line when such dividing line insertion will divide a critical dimensions area; or a method for, after inserting all insertable dividing lines inside each polygon, defining a cost for each dividing line producing fine drawing data or dividing a critical dimensions area, sequentially extracting the dividing lines for which the sum of said cost and the length of the dividing line is smallest, and separating the basic geometric shapes formed by this dividing line side and the sides of the polygon.

It is also possible to manufacture high design precision semiconductor devices by executing a fine drawing data editing process according to the present invention editing by a manual process fine drawing data that could not be processed by the basic geometric shape separation process.

It is also possible to manufacture high design precision semiconductor devices by executing an automatic chamfer member editing process for suppressing the generation of fine drawing data by deleting or revising unnecessary chamfered members.

The automatic chamfer member editing process can be achieved by: editing slightly inclined sides that are not chamfered members; editing slightly inclined sides that are not chamfered members by generating a new side bisecting the area of the triangle unit formed by said slightly inclined side; or a method for determining whether a new side should be generated by referencing results obtained by simulation or experimentation using as reference parameters, the length of the slightly inclined side, the angle formed by said slightly inclined side and a second side connecting thereto, and which side (inside or outside the polygon) of the slightly inclined side is to be drawn by the charged beam.

High design precision semiconductor devices can also be manufactured by executing the triangle separation process after the automatic chamfer member editing process.

A drawing data generating apparatus according to the present invention can supply high design precision semiconductor devices by comprising the functionality of: an automatic critical dimensions (CD) area separating means; a triangle separation means; an automatic critical dimensions extraction means; a basic geometric shape separation means; a fine drawing data editing means; and/or an automatic chamfer member editing means.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A charged beam pattern data generating method comprising:
   a data receiving step for receiving design layout data;
   an automatic critical dimensions (CD) area separating step for separating critical dimensions areas requiring high dimensional precision contained in the design layout data;
   a basic geometric shape separating step for dividing polygons remaining after the automatic critical dimensions (CD) area separating step, into basic geometric shapes;
   wherein the automatic critical dimensions (CD) area separating step is performed before the basic geometric shape separating step; and
   a generating step for generating the charred beam pattern data using the basic geometric shapes.

2. The charged beam pattern data generating method of claim 1, wherein the automatic critical dimensions (CD) area separating steps includes detecting internal sides of the polygons, and not using the internal sides as candidate sides for critical dimensions area separation.

3. The charged beam pattern data generating method of claim 1, wherein the automatic critical dimensions (CD) area separating step includes interrupting critical dimensions area separation when fine drawing data is generated as a result of the critical dimensions area separation.

4. The charged beam pattern data generating method of claim 1, wherein the automatic critical dimensions (CD) area separating step includes defining plural critical dimensions values.

5. The charged beam pattern data generating method of claim 4, wherein the automatic critical dimensions (CD) area separating step includes defining a priority sequence for the plural critical dimensions values.

6. The charged beam pattern data generating method of claim 1, further comprising:
   a scanning step for scanning polygon widths to automatically extract critical dimensions; and
   an inputting step for inputting extracted critical dimensions to the automatic critical dimensions (CD) area separating step so that the automatic critical dimensions (CD) area separating step utilizes the extracted critical dimensions to separate the critical dimensions areas requiring high dimensional precision.

7. A charged beam pattern data generating method comprising:
   a data receiving step for receiving design layout data;
   a triangle separation step for separating right triangle components from polygons contained in the design layout data; and
   a generating step for generating the charred beam pattern data using the right triangle components.

8. The charged beam pattern data generating method of claim 7, wherein the triangle separation step does not separate triangles having a slightly sloping side during right triangle separation.

9. A charged beam pattern data generating method comprising:
   a data receiving step for receiving design layout data; and
   a basic geometric shape separation step for selecting the best separation results from the design layout data based on a predetermined evaluation standard from a plurality of separation results formed by sequentially inserting dividing lines from each vertex of a polygon; and
   a generating step for generating the charged beam pattern data using the best separation results.

10. The charged beam pattern data generating method of claim 9, wherein the basic geometric shape separation step includes selecting the separation results of which a sum of lengths of representative sides of fine drawing data affecting a dimensional precision of patterns is smallest.

11. The charged beam pattern data generating method of claim 9, wherein the basic geometric shape separating step includes calculating lengths of representative sides of fine shapes affecting dimensional precision of a resist pattern for division results, for each combination of the dividing lines during dividing lines insertion, and
   selecting the separation results for which the calculated value is smallest.

12. The charged beam pattern data generating method of claim 9, wherein the basic geometric shape separating step does not insert a dividing line when dividing line insertion creates fine drawing data.

13. The charged beam pattern data generating method of claim 9, wherein the basic geometric shape separation step does not insert a dividing line when dividing line insertion divides a critical dimensions area.

14. The charged beam pattern data generating method of claim 9, wherein the basic geometric shape separation step includes, after inserting all of the dividing lines which are insertable inside each polygon, defining a cost, sequentially extracting the dividing lines for which a product of the cost and a length of the dividing line is smallest, separating the basic geometric shapes formed by the dividing line side and sides of the polygons, and for each dividing line, producing fine drawing data or dividing a critical dimensions area.

15. A charged beam pattern data generating method comprising:

a data receiving step for receiving design layout data;

a basic geometric shape separating step for dividing polygons contained in the design layout data into basic geometric shapes;

a fine drawing data editing step for editing fine drawing data that can not be separated by the basic geometric shape separation step; and a generating step for generating the charred beam pattern data using the basic geometric shaves and the fine drawing data.

16. A charged beam pattern data generating method comprising:

a data receiving step for receiving design layout data;

an automatic chamfer member editing step for suppressing generation of fine drawing data by deleting or revising unnecessary chamfered members contained in the design layout data; and a generating step for generating the charged beam pattern data using the design layout data without the unnecessary chamfered members.

17. A charged beam pattern data generating method comprising:

a data receiving step for receiving design layout data;

an automatic chamfer member editing step for suppressing generation of fine drawing data by revising slightly inclined sides that are not chamfered members contained in the design layout data; and a generating step for generating the charged beam pattern data using the design layout data and the slightly inclined sides that are not chamfer members.

18. The charged beam pattern data generating method of claim 17, wherein the automatic chamfer member editing step includes revising slightly inclined sides that are not chamfered members by generating a new side bisecting an area of a triangle unit formed by the slightly inclined sides.

19. The charged beam pattern data generating method of claim 17, wherein the automatic chamfer member editing step includes revising slightly inclined sides that are not chamfered members by generating a new side, and determining for each of the slightly inclined sides whether a new side should be generated, using a length of each slightly inclined side, an angle formed by each slightly inclined side and a second side connecting thereto, and a side of each slightly inclined side which is to be drawn by an electron beam.

20. A charged beam pattern data generating method comprising:

a data receiving step for receiving design layout data;

an automatic chamfer editing step for suppressing generation of fine drawing data by deleting or revising unnecessary chamfered members contained in the design layout data;

a triangle separating step for separating right triangle components from polygons contained in the design layout data;

wherein the triangle separating step is performed after the automatic chamfer member editing step; and a generating step for generating the charged beam pattern data using the design layout data without unnecessary chamfer member and using the right triangle components.

21. A charged beam pattern data generating apparatus comprising:

data receiving means for receiving design layout data;

an automatic critical dimensions (CD) area separating means for separating critical dimensions areas requiring high dimensional precision contained in the design layout data; and generating means for generating the charged beam pattern data using the critical dimension areas.

22. A charged beam pattern data generating apparatus comprising:

data receiving means for receiving design layout data;

a triangle separation means for pre-separating right triangle components from polygons contained in the design layout data; and generating means for generating the charged beam pattern data using the right triangle components.

23. A charged beam pattern data generating apparatus comprising:

data receiving means for receiving design layout data;

automatic critical dimensions extraction means for scanning polygon widths to automatically extract critical dimensions areas contained in the design layout data using extracted critical dimensions;

means for inputting the extracted critical dimensions to said automatic critical dimensions (CD) area separating means; and generating means for generating the charred beam pattern data using the extracted critical dimensions areas.

24. A charged beam pattern data generating apparatus comprising:

data receiving means for receiving design layout data;

basic geometric shape separation means for selecting the best separation results from the design layout data based on a predetermined evaluation standard from among plural separation results formed by sequentially inserting dividing lines from each vertex of a polygon; and generating means for generating the charged beam pattern data using the best separation results.

25. A charged beam pattern data generating apparatus comprising:

data receiving means for receiving design layout data;

fine drawing data editing means for editing fine drawing data contained in the design layout data that can not be processed by a basic geometric shape separation device; and generating means for generating the charged beam pattern data using the fine drawing data.

26. A charged beam pattern data generating apparatus comprising:

data receiving means for receiving design layout data; and an automatic chamfer member editing means for suppressing generation of fine drawing data by deleting or revising unnecessary chamfered members contained in the design layout data; and generating means for generating the charged beam pattern data without the unnecessary chamfered members.

27. A charged beam pattern data generating apparatus comprising:

data receiving means for receiving design layout data;

an automatic chamfer member editing means for suppressing generation of fine drawing data by revising slightly inclined sides that are not chamfered members contained in the design layout data; and generating means for generating the charred beam pattern data using the design layout data and the slightly inclined sides that are not chamfered members.

* * * * *